US012429916B2

(12) United States Patent
Yoon et al.

(10) Patent No.: US 12,429,916 B2
(45) Date of Patent: Sep. 30, 2025

(54) ELECTRONIC DEVICE INCLUDING DISPLAY

(71) Applicant: SAMSUNG ELECTRONICS CO., LTD., Suwon-si (KR)

(72) Inventors: Chulhyo Yoon, Suwon-si (KR); Jungchul An, Suwon-si (KR); Jiwon Kim, Suwon-si (KR); Hosang Nam, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/097,654

(22) Filed: Jan. 17, 2023

(65) Prior Publication Data

US 2023/0333598 A1 Oct. 19, 2023

Related U.S. Application Data

(63) Continuation of application No. PCT/KR2022/021755, filed on Dec. 30, 2022.

(30) Foreign Application Priority Data

Apr. 15, 2022 (KR) .................. 10-2022-0047028
May 27, 2022 (KR) .................. 10-2022-0065658

(51) Int. Cl.
*G06F 1/16* (2006.01)
*G06F 3/046* (2006.01)
(Continued)

(52) U.S. Cl.
CPC .......... *G06F 1/1652* (2013.01); *G06F 1/1637* (2013.01); *G06F 1/1641* (2013.01);
(Continued)

(58) Field of Classification Search
CPC .... G06F 1/1652; G06F 1/1656; G06F 1/1681; G06F 3/041; G06F 3/0412; G06F 3/044;
(Continued)

(56) References Cited

U.S. PATENT DOCUMENTS 10,310,644 B2 6/2019 Park
2010/0295818 A1* 11/2010 Lin ....................... G06F 3/0446
345/174
(Continued)

FOREIGN PATENT DOCUMENTS

KR 10-2015-0113669 A 10/2015
KR 10-2015-0126297 A 11/2015
(Continued)

OTHER PUBLICATIONS

International Search Report dated Mar. 24, 2023 for PCT/KR2022/021755.
(Continued)

*Primary Examiner* — Jason M Mandeville
(74) *Attorney, Agent, or Firm* — Nixon & Vanderhye P.C.

(57) ABSTRACT

An electronic device includes: a flexible display; an input module disposed between a surface formed by a first housing and a second housing supporting the flexible display and the flexible display, and including a first pattern layer and a second pattern layer; and waterproof adhesives disposed on each of the first housing and the second housing, wherein the first pattern layer is disposed on a surface of the input module facing the waterproof adhesives, and includes first signal patterns and first dummy patterns disposed in an area corresponding to the waterproof adhesive, and wherein the second pattern layer is disposed on the other side of the input module facing the flexible display.

19 Claims, 20 Drawing Sheets

(51) Int. Cl.
  *H05K 5/02* (2006.01)
  *H04M 1/02* (2006.01)
(52) U.S. Cl.
  CPC .......... *G06F 1/1656* (2013.01); *G06F 1/1681* (2013.01); *G06F 3/046* (2013.01); *H05K 5/0226* (2013.01); *G06F 2203/04102* (2013.01); *H04M 1/0214* (2013.01); *H04M 1/0268* (2013.01)
(58) Field of Classification Search
  CPC ...... G06F 3/0441; G06F 3/0445; G06F 3/046; G06F 2203/04102; G06F 1/16; G06F 1/1637; G06F 1/1641; H05K 5/0226; H04M 1/0214; H04M 1/0268
  USPC ......................................................... 345/174
  See application file for complete search history.

(56) References Cited

U.S. PATENT DOCUMENTS

| | | | |
|---|---|---|---|
| 2014/0001018 A1* | 1/2014 | Lee | H01H 1/06 200/275 |
| 2015/0317020 A1 | 11/2015 | Watanabe et al. | |
| 2016/0266692 A1* | 9/2016 | Park | B32B 27/281 |
| 2019/0072997 A1* | 3/2019 | Cha | G06F 1/1656 |
| 2019/0163003 A1 | 5/2019 | Kim et al. | |
| 2020/0162596 A1 | 5/2020 | Kim et al. | |
| 2020/0319672 A1* | 10/2020 | Kim | G06F 1/1637 |
| 2021/0357048 A1 | 11/2021 | Kishimoto et al. | |
| 2021/0389809 A1 | 12/2021 | Choi | |
| 2022/0011819 A1 | 1/2022 | Shin et al. | |
| 2022/0300042 A1 | 9/2022 | Heo et al. | |
| 2023/0229194 A1 | 7/2023 | Kishimoto et al. | |
| 2023/0244272 A1 | 8/2023 | Lee et al. | |
| 2024/0061524 A1 | 2/2024 | Lee et al. | |

FOREIGN PATENT DOCUMENTS

| | | |
|---|---|---|
| KR | 10-2016-0109964 A | 9/2016 |
| KR | 10-2020-0057236 A | 5/2020 |
| KR | 10-2021-0073194 | 6/2021 |
| KR | 10-2021-0123699 | 10/2021 |
| KR | 10-2318028 | 10/2021 |
| KR | 10-2021-0150942 | 12/2021 |
| KR | 10-2021-0153260 A | 12/2021 |
| KR | 10-2022-0006669 | 1/2022 |
| KR | 10-2022-0073302 A | 6/2022 |
| KR | 10-2023-0011205 A | 1/2023 |
| KR | 10-2023-0111663 A | 7/2023 |
| KR | 10-2023-0116972 A | 8/2023 |

OTHER PUBLICATIONS

Written OPinion dated Mar. 24, 2023 for PCT/KR2022/021755.
Extended European Search Report dated Mar. 3, 2025 for EP Application No. 22937587.8.

* cited by examiner

ELECTRONIC DEVICE INCLUDING DISPLAY

CROSS-REFERENCE TO RELATED APPLICATIONS

This application is a continuation of International Application No. PCT/KR2022/021755 designating the United States, filed on Dec. 30, 2022, in the Korean Intellectual Property Receiving Office and claiming priority to Korean Patent Application No. 10-2022-0047028, filed on Apr. 15, 2022, in the Korean Intellectual Property Office, and to Korean Patent Application No. 10-2022-0065658, filed on May 27, 2022, in the Korean Intellectual Property Office, the disclosures of all of which are incorporated by reference herein in their entireties.

BACKGROUND

Field

The disclosure relates to an electronic device including a display.

Description of Related Art

The possibility that the electronic device will be exposed to moisture of the electronic device may increase due to an increase in outdoor activities. Also, in daily life, due to the convenience of products including a waterproof function, a demand related to waterproofing of electronic devices is increasing. In order to implement a waterproof function, the electronic device may prevent/reduce inflow of moisture from the outside through a waterproof tape that surrounds major electronic components.

The electronic device may include an input module for electromagnetic interaction such as a magnetic field change or a capacitance change by a pen for input through an external object such as a stylus pen.

As the input module is disposed, the overall weight of the electronic device may increase, and thus, a method of reducing the weight and maintaining waterproofing through a waterproof member attached to the input module is needed.

SUMMARY

According to an example embodiment, an electronic device may comprise: a first housing including a first surface facing a first direction; a second housing including a second surface facing the first direction; a hinge structure including a hinge rotatably connecting the first housing and the second housing with respect to a folding axis and configured to provide an unfolded state in which the first surface and the second surface face substantially the same direction or a folded state in which the first surface and the second surface substantially face each other; and a flexible display disposed on the first surface and the second surface across the folding axis, including a first display area corresponding the first surface, a second display area corresponding the second surface and a third display area between the first display area and the second display area. According to an example embodiment, the electronic device may further comprise: an input module including a first pattern layer and a second pattern layer, the input module disposed between the flexible display and a surface formed by the first housing and the second housing, and configured to detect an external object based on an electromagnetic interaction between the external object and the first pattern layer and the second pattern layer; and waterproof adhesives disposed on each of the first housing and the second housing. According to an example embodiment, the first pattern layer may be disposed on a surface of the input module facing the waterproof adhesives and may include first signal patterns and first dummy patterns disposed on an area corresponding to the waterproof adhesive. According to an example embodiment, the second pattern layer may be disposed on another surface of the input module facing the flexible display.

According to an example embodiment, the electronic device may comprise: a first housing including a first surface facing a first direction; a second housing including a second surface facing the first direction; a hinge structure including a hinge rotatably connecting the first housing and the second housing with respect to a folding axis and configured to provide an unfolded state in which the first surface and the second surface face substantially the same direction or a folded state in which the first surface and the second surface substantially face each other; a flexible display disposed on the first surface and the second surface across the folding axis, including a first display area corresponding the first surface, a second display area corresponding the second surface and a third display area between the first display area and the second display area; an input module including a first pattern layer and a second pattern layer, the input module disposed between the flexible display and a surface formed by the first housing and the second housing, and configured to detect an external object based on an electromagnetic interaction between the external object and the first pattern layer and the second pattern layer; and waterproof adhesives disposed on each of the first housing and the second housing. According to an example embodiment, the first pattern layer may be disposed on a surface of the input module facing the waterproof adhesives and may include first signal patterns and first dummy patterns. According to an example embodiment, the second pattern layer may be disposed on another surface of the input module facing the flexible display and includes second signal patterns disposed in a direction perpendicular to the first signal patterns and second dummy patterns disposed between the second signal patterns. According to an example embodiment, the first dummy patterns and the second dummy patterns overlap each other, in an area corresponding to the waterproof adhesive, when the flexible display is viewed from the outside in the unfolded state. According to an example embodiment, the second dummy patterns among the first dummy patterns and the second dummy patterns may be disposed in a remaining area spaced apart from the waterproof adhesive.

According to an example embodiment, an electronic device can maintain waterproof performance while removing some components of the input module. The electronic device can secure the waterproof performance of a waterproof weak portion of a foldable display and maintain the planarization of the display surface.

The effects that can be obtained from the present disclosure are not limited to those described above, and any other effects not mentioned herein will be clearly understood by those having ordinary knowledge in the art to which the present disclosure belongs, from the following description.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
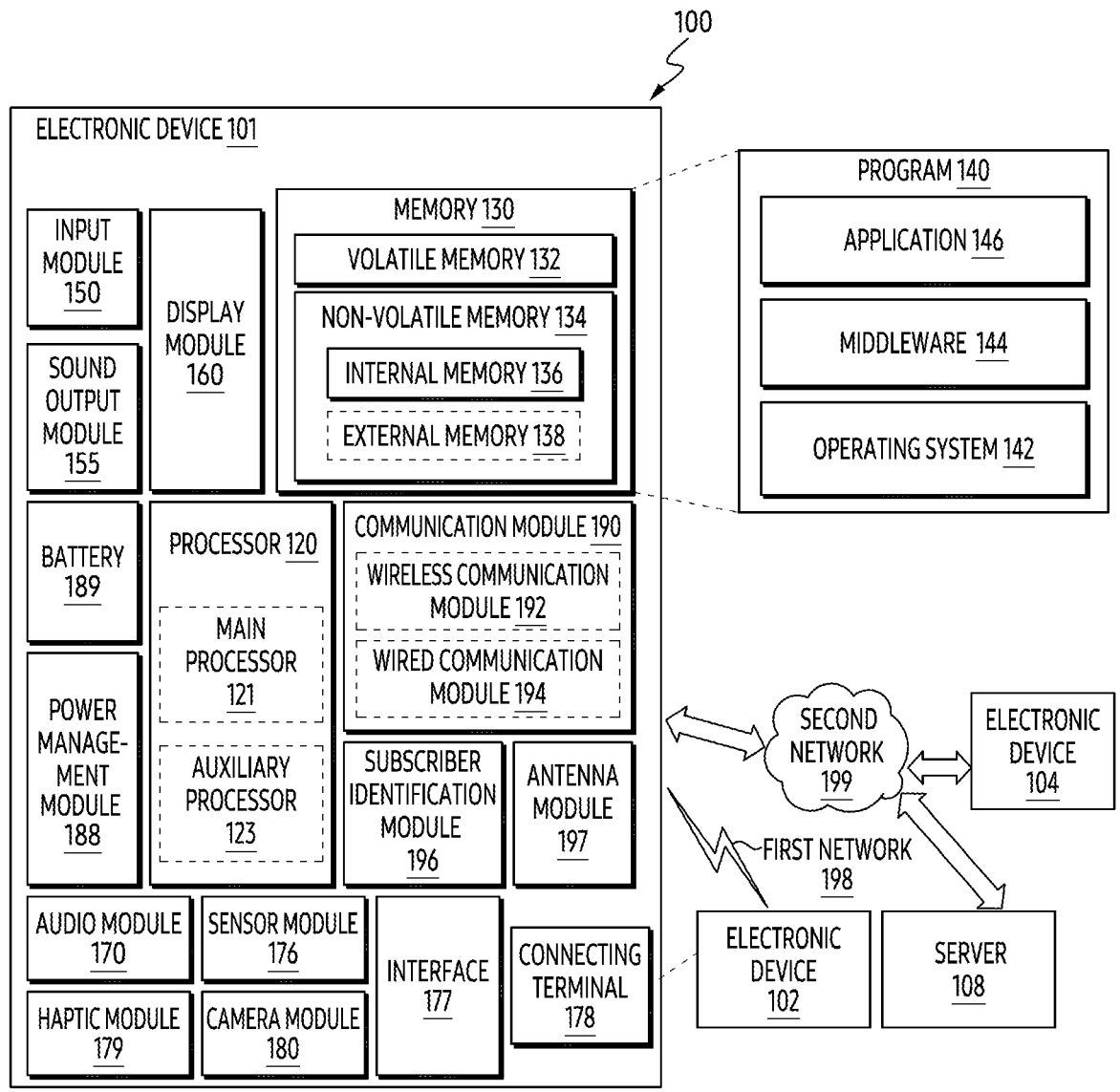
FIG. 1 is a block diagram illustrating an example electronic device in a network environment according to various embodiments.

FIG. 1 is a block diagram illustrating an example electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
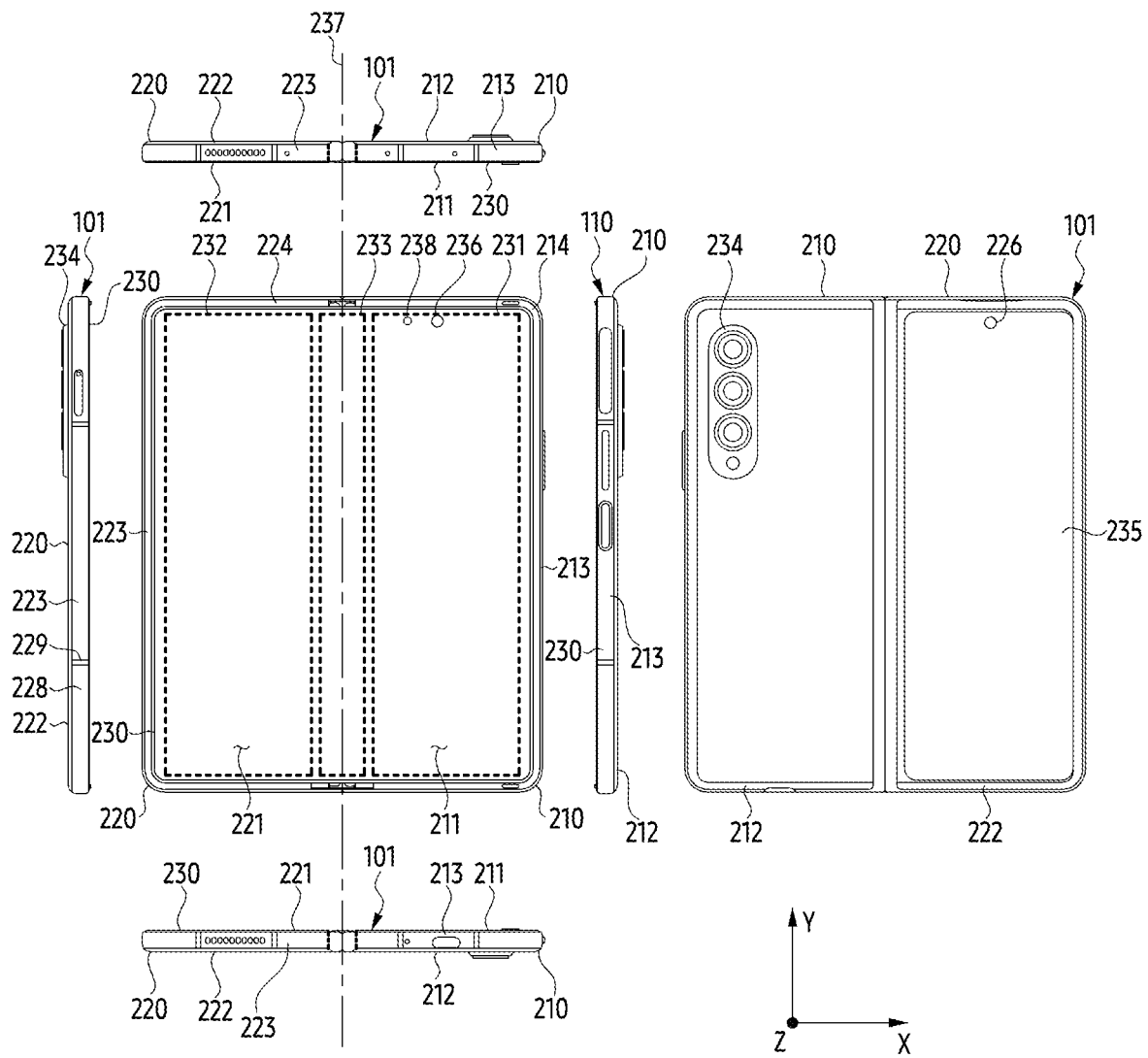
FIG. 2A is a diagram illustrating an example electronic device in an unfolded state according to various embodiments.
Figure 2B:
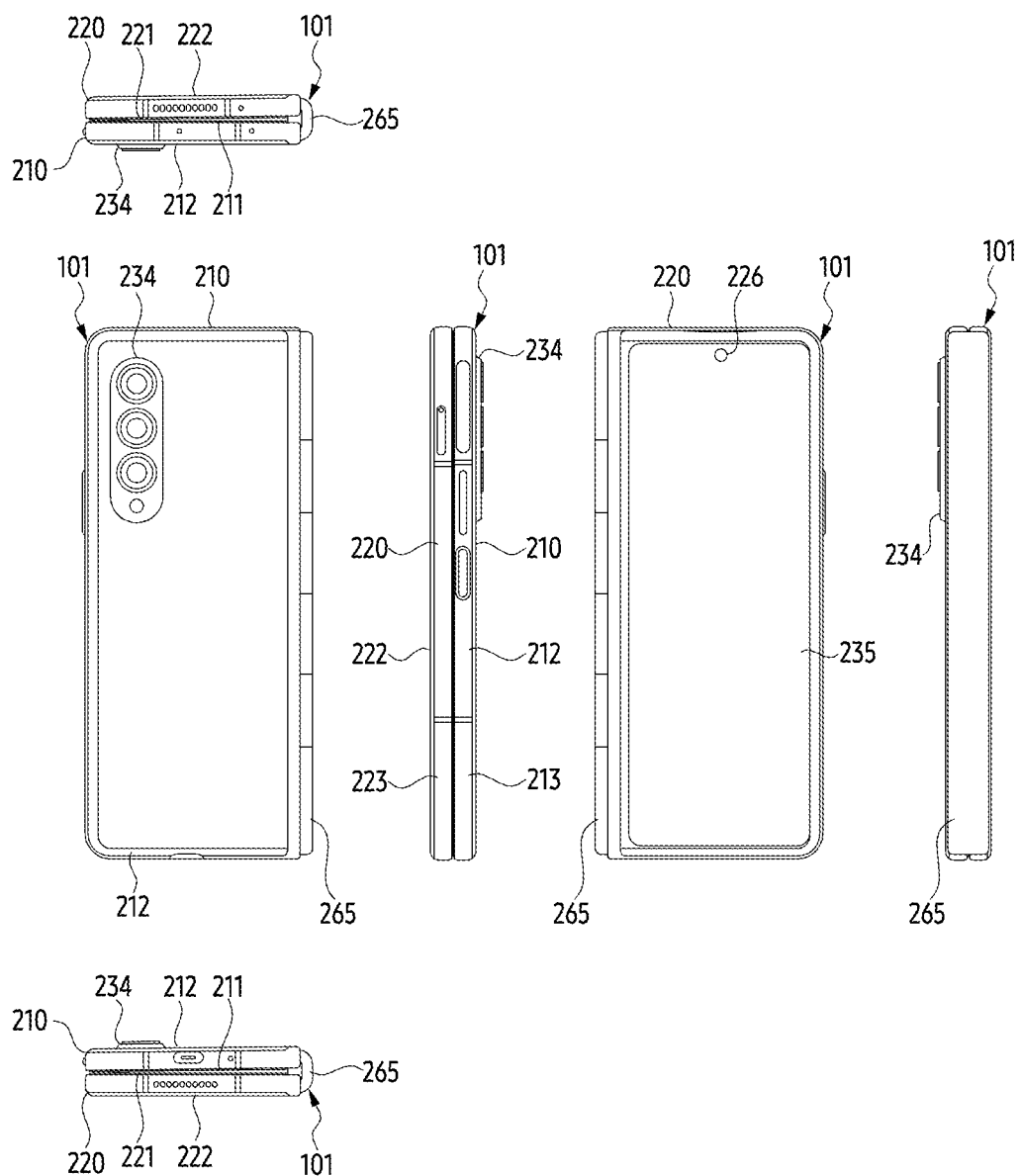
FIG. 2B is a diagram illustrating an example electronic device in a folded state according to various embodiments.
Figure 2C:
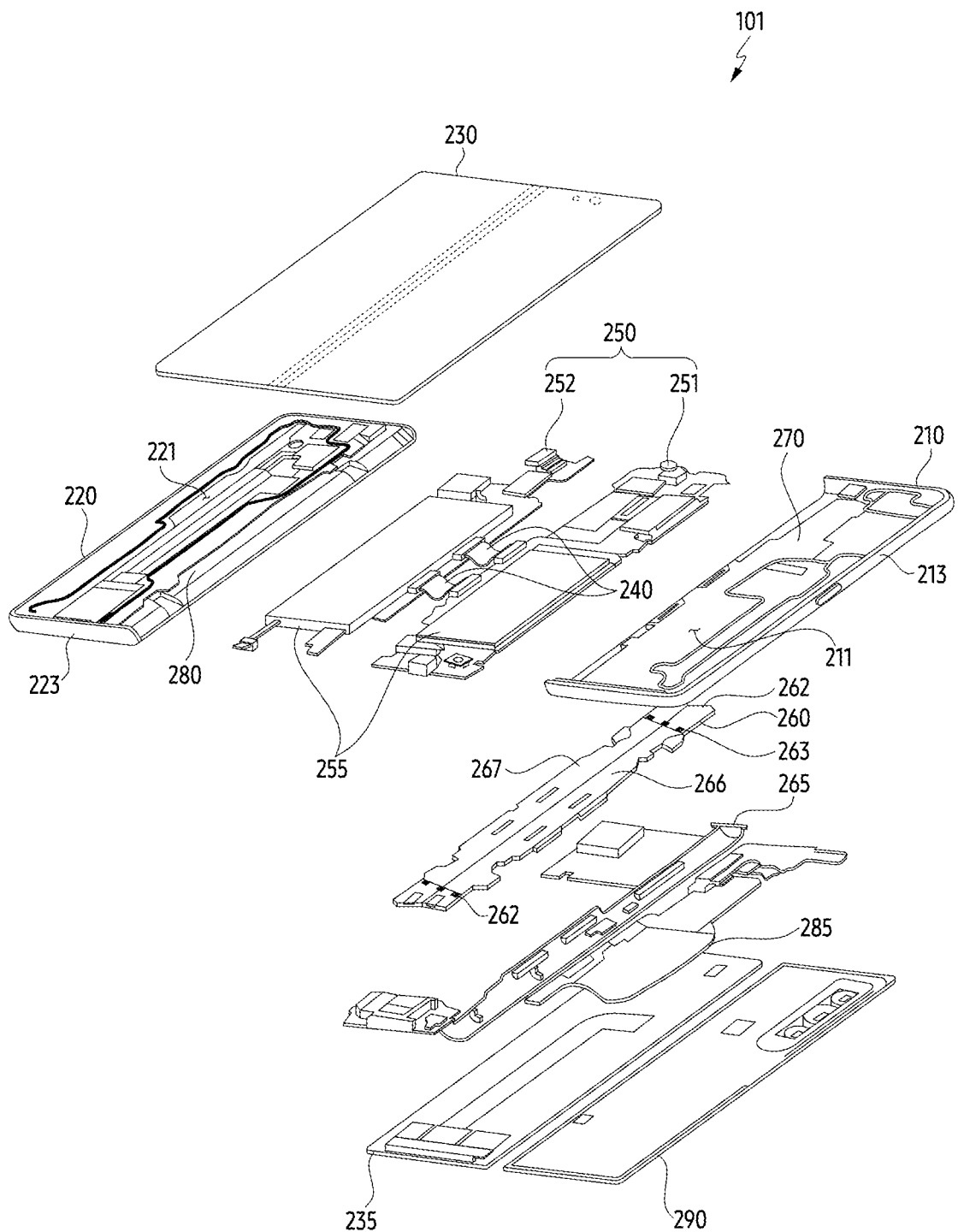
FIG. 2C is an exploded perspective view of an electronic device according to various embodiments.

FIG. 2A is a diagram illustrating an example electronic device in an unfolded state according to various embodiments, FIG. 2B is a diagram an example of an electronic device in a folded state according to various embodiments, and FIG. 2C is an exploded perspective view of the electronic device according to various embodiments.

Referring to FIGS. 2A, 2B, and 2C, the electronic device 101 may include a first housing 210, a second housing 220, and a flexible display panel 230.

In an embodiment, the first housing 210 may include a first surface 211, a second surface 212 facing away the first surface 211, and a first side 213 surrounding at least a portion of the first surface 211 and the second surface 212. In an embodiment, the second surface 212 may further include at least one one camera 234 exposed out through part of the second surface 212. In an embodiment, the first housing 210 may include a first protection member 214 disposed along an edge of the first surface 211. In an embodiment, the first housing 210 may provide a space formed by the first surface 211, the second surface 212, and the first side 213, for mounting therein various components of the electronic device 101. In an embodiment, the first side 213 and a second side 223 may include a conductive material, a non-conductive material, or a combination thereof. For example, the second side 223 may include a conductive member 228 and a non-conductive member 229. The conductive member 228 may include a plurality of conductive members, and the plurality of conductive members may be spaced apart from each other. The non-conductive member 229 may be disposed between the plurality of conductive members. An antenna structure may be formed by some of the plurality of conductive members and the plurality of non-conductive members or a combination thereof.

In an embodiment, the second housing 220 may include a third surface 221, a fourth surface 222 facing away the third surface 221, and a second side 223 surrounding at least part of the third surface 221. In an embodiment, the fourth surface 222 may further include a display panel 235 disposed thereon. A camera 226 may be disposed to face the fourth surface 222 from the inside of the second housing 220 so as to obtain an external image through the fourth surface 222. The camera 226 may be disposed underneath the display panel 235 to be covered by the display panel 235. In an embodiment, the camera 226 may be disposed underneath the display panel 235 and the display panel 235 may be aligned with a lens of the camera 226, so that it may include an aperture to transmit light from the outside to the camera 226. According to an embodiment, each of the first housing 210 and the second housing 220 may include a first protection member 214 and a second protection member 224, respectively. The first protective member 214 and the second protective member 224 may be disposed on the first surface 211 and the third surface 221 along a periphery of a flexible display panel 230. The first protective member 214 and the second protective member 224 may be formed to protect inflow of foreign substances (e.g., dust or moisture) through a gap between the flexible display panel 230 and the first housing 210 and the second housing 220. The first protection member 214 may be disposed along an edge of a first display area 231, and the second protection member 224 may be disposed along an edge of a second display area 232. The first protective member 214 may be formed attached to the first side 213 of the first housing 210, or may be formed integrally with the first side 213. The second protective member 224 may be formed attached to the second side 223 of the second housing 220, or may be formed integrally with the second side 223.

In an embodiment, the second side 223 may be pivotably or rotatably connected to the first side 213 through a hinge structure 260 mounted onto a hinge cover 265. The hinge structure 260 may include a hinge module 262, a first hinge plate 266, and a second hinge plate 267. The first hinge plate 266 may be connected to the first housing 210, and the second hinge plate 267 may be connected to the second housing 220. In an embodiment, the second housing 220 may provide a space defined by the third surface 221, the fourth surface 222 facing and spaced away from the third surface 221, and the side 223 surrounding at least part of the third surface 221 and the fourth surface 222, as a space for mounting various components of the electronic device 101. In an embodiment, the flexible display panel 230 may include a window exposed to the outside. The window may be formed to protect the surface of the flexible display panel 230 and include a transparent member, so as to transmit visual information provided from the flexible display panel 230 to the outside. The window may include a glass material such as e.g., ultra-thin glass (UTG) or a polymer material such as e.g., polyimide (PI). In an embodiment, the flexible display panel 230 may be disposed on the first surface 211 of the first housing 210 and the third surface 221 of the second housing 220 across the hinge cover 265. The flexible display panel 230 may include a first display area 231 disposed on the first surface 211 of the first housing, the second display area 232 disposed on the third surface 221 of the second housing, and a third display area 233 disposed between the first display area 231 and the second display area 232. The first display area 231, the second display area 232, and the third display area 233 may form a front surface of the flexible display panel 230.

According to an embodiment, an opening may be formed in a portion of the display area of the flexible display panel 230, or a recess or an opening may be formed in a supporting member (e.g., a bracket) supporting the flexible display panel 230. The electronic device 101 may include at least one of a sensor module 238 or a camera 236 aligned with the recess or the opening. For example, the first display area 231 may further include the camera 236 capable of acquiring an image from the outside through a part of the first display area 231 and the sensor module 238 generating an electrical signal or data value corresponding to an external environment state. According to an embodiment, one or more of the sensor module 238 or the camera 236 may be arranged on a back side of the flexible display panel 230 corresponding to the first display area 231 or the second display area 232 of the flexible display panel 230. For example, at least one of the camera 236 or the sensor module 238 may be disposed underneath the flexible display panel 230 to be covered by the flexible display panel 230. At least one of the camera 236 or the sensor module 238 may be covered by the flexible display panel 230 so as to be not exposed to the outside. However, the configuration is not limited thereto, and the flexible display panel 230 may include an opening for exposing the camera 236 and/or the sensor module 238 to the outside. Although not shown in FIGS. 2A and 2B, according to an embodiment, the flexible display panel 230 may further include a rear surface opposite to the front surface. In an embodiment, the flexible display panel 230 may be supported by a first supporting member 270 of the first housing 210 and a second supporting member 280 of the second housing 220.

In an embodiment, the hinge structure 260 may be configured to rotatably connect the first supporting member 270 forming the first housing 210 and fastened to the first hinge plate 266, and the second supporting member 280 forming the second housing 220 and fastened to the second hinge plate 267.

In an embodiment, the hinge cover 265 surrounding the hinge structure 260 may be at least partially exposed to the outside through between the first housing 210 and the second housing 220, while the electronic device 101 is in the folded state. In an embodiment, the hinge cover 265 may be covered by the first housing 210 and the second housing 220 while the electronic device 101 is in the unfolded state.

In an embodiment, the electronic device 101 may be configured to be folded with respect to a folding shaft 237 passing through the hinge cover 265. For example, the hinge cover 265 may be disposed in between the first housing 210 and the second housing 220 of the electronic device 101 to allow the electronic device 101 to be bent, curved or folded. For example, the first housing 210 may be connected to the second housing 220 through the hinge structure 260 mounted on the hinge cover 265, and may rotate with respect to the folding shaft 237. For example, the hinge structure 260 may include hinge modules 262 disposed at both ends of the first hinge plate 266 and the second hinge plate 267. The hinge module 262 may include hinge gears engaged with each other therein, so that the first hinge plate 266 and the second hinge plate 267 are caused to rotate about the folding axis. The first housing 210 coupled to the first hinge plate 266 may be connected to the second housing 220 coupled to the second hinge plate 267, and may be caused to rotate about the folding axis by the hinge modules 262.

In an embodiment, the electronic device 101 may be folded to face each other by rotating the first housing 210 and the second housing 220 with respect to the folding shaft 237. In an embodiment, the electronic device 101 may be folded such that the first housing 210 and the second housing 220 can be laid over or overlap each other.

Referring to FIG. 2C, the electronic device 101 may include a first supporting member 270, a second supporting member 280, a hinge structure 260, a flexible display panel 230, and a printed circuit board 250, a battery 255, a hinge cover 265, an antenna 285, a display panel 235 and a rear plate 290. According to an embodiment, the electronic device 101 may omit at least one of those components or may further include one or more other components. At least one of the components of the electronic device 300 may be the same as or similar to at least one of the components of the electronic device 101 of FIG. 1, 2A, or 2B, and redundant descriptions thereof will be refrained from the following.

The first housing 210 and the second housing 220 may support a flexible display (e.g., the flexible display 230 of FIG. 2A). The flexible display panel may include a front surface that emits light and provides information, and a rear surface facing the front surface. In the case that the first surface of the first housing 210 (e.g., the first surface 211 of FIG. 2A) faces the third surface of the second housing 220 (e.g., the third surface 221 of FIG. 2A), the flexible display panel may be in a folding state in which the first display area 231 and the second display area 232 face each other. In case that the first surface 211 of the first housing 210 and the third surface 221 of the second housing 220 look in the same direction, the flexible display 230 may be in an unfolded state in which the first display area 231 and the second display area 232 of the flexible display 230 look in the same direction.

According to an embodiment, the electronic device 101 may provide a fully unfolded state by the hinge structure 260 of the first housing 210 and the second housing 220. The first support member (270) is connected to the second support member (280) through the hinge structure (260) so that the electronic device (101) can be converted into a folding state or an unfolding state. The first support member 270 and the second support member 280 attached to the hinge plates 266 and 267 of the hinge structure 260 may move, by rotating the hinge gear 263. The hinge plates 266 and 267 may include a first hinge plate 266 coupled to the first support member 270 and a second hinge plate 267 coupled to the second support member 280. The electronic device 101 may be switched to a folding state or an unfolding state by rotation of the hinge gear 263.

The hinge structure 260 may include a hinge module 262, a first hinge plate 266, and a second hinge plate 267. The hinge module 262 may include a hinge gear 263 that causes the first hinge plate 266 and the second hinge plate 267 to be pivotable. The hinge gears 263 may rotate with being engaged with each other to cause the first hinge plate 266 and the second hinge plate 267 to rotate. The hinge module 262 may include a plurality of hinge modules. Each of the plurality of hinge modules may be disposed at both ends formed by the first hinge plate 266 and the second hinge plate 267.

The first hinge plate 266 may be coupled to the first supporting member 270 of the first housing 210, and the second hinge plate 267 may be coupled to the second supporting member 280 of the second housing 220. The first housing 210 and the second housing 220 may rotate corresponding to the rotation of the first hinge plate 266 and the second hinge plate 267.

The first housing 210 may include the first supporting member 270 and the second supporting member 280. The first supporting member 270 may be partially surrounded by the first side 213, and the second supporting member 280 may be partially surrounded by the second side 223. The first supporting member 270 may be integrally formed with the first side 213, and the second supporting member 280 may be integrally formed with the second side 223. According to an embodiment, the first supporting member 270 may be formed separately from the first side 213, and the second supporting member 280 may be formed separately from the second side 223. The first side 213 and the second side 223 may be formed of a metal material, a non-metal material, or a combination thereof, and may be used as an antenna.

The first supporting member 270 may be coupled to the flexible display panel 230 on one surface, and coupled to the rear plate 290 on the other surface. Further, the second supporting member 280 may be coupled to the flexible display panel 230 on one surface and coupled to the display panel 235 on the other surface.

The printed circuit board 250 and the battery 255 may be disposed in between a surface formed by the first supporting member 270 and the second supporting member 280 and a surface formed by the display panel 235 and the rear plate 290. The printed circuit board 250 may be separated to be disposed on each of the first supporting member 270 of the first housing 210 and the second supporting member 280 of the second housing 220. The shapes of the first printed circuit board 251 disposed on the first supporting member 270 and the second printed circuit board 252 disposed on the second supporting member 280 may be different from each other depending on the space inside the electronic device. Components for implementing various functions of the electronic device 10 may be mounted onto the first printed circuit board 251 and the second printed circuit board 252. According to an embodiment, on the first printed circuit board 251 may be mounted various components for implementing the overall function of the electronic device 101, and on the second printed circuit board 252 may be disposed various electronic components for implementing some functions of the first printed circuit board 251 or components for driving the display panel 235 disposed on the fourth surface 222. The first printed circuit board 251 and the second printed circuit board 252 may be electrically connected to each other by a flexible printed circuit board 240.

The battery 255 may be, for example, a device to supply electric power to one or more of the components of the electronic device 101, and may include, for example, a non-rechargeable primary battery, or a rechargeable secondary battery, or a fuel cell. At least some of the battery 255 may be disposed on substantially the same plane as the printed circuit board 250. The surfaces of the printed circuit board 250 and the battery 255, which are formed with substantially the same surface, may be disposed on one surface of the first supporting member 270 and the second supporting member 280 (e.g., a side facing the second surface 212 and the fourth surface 222, or a side facing the display panel 235 and the rear plate 290). For example, the flexible display panel 230 may be disposed on the first surface 211 and the third surface 221, and the printed circuit board 250 and the battery 255 may be disposed on the second surface 212 and the fourth surface 222 facing the side on which the flexible display panel 230 is disposed.

In an embodiment, the antenna 285 may be disposed between the rear plate 290 and the battery 255 in an embodiment. The antenna 285 may include, for example, a near field communication (NFC) antenna, a wireless charging antenna, and/or a magnetic secure transmission (MST) antenna. The antenna 285 may, for example, perform short-range communication with an external device or wirelessly transmit/receive power required for charging.

Figure 3:
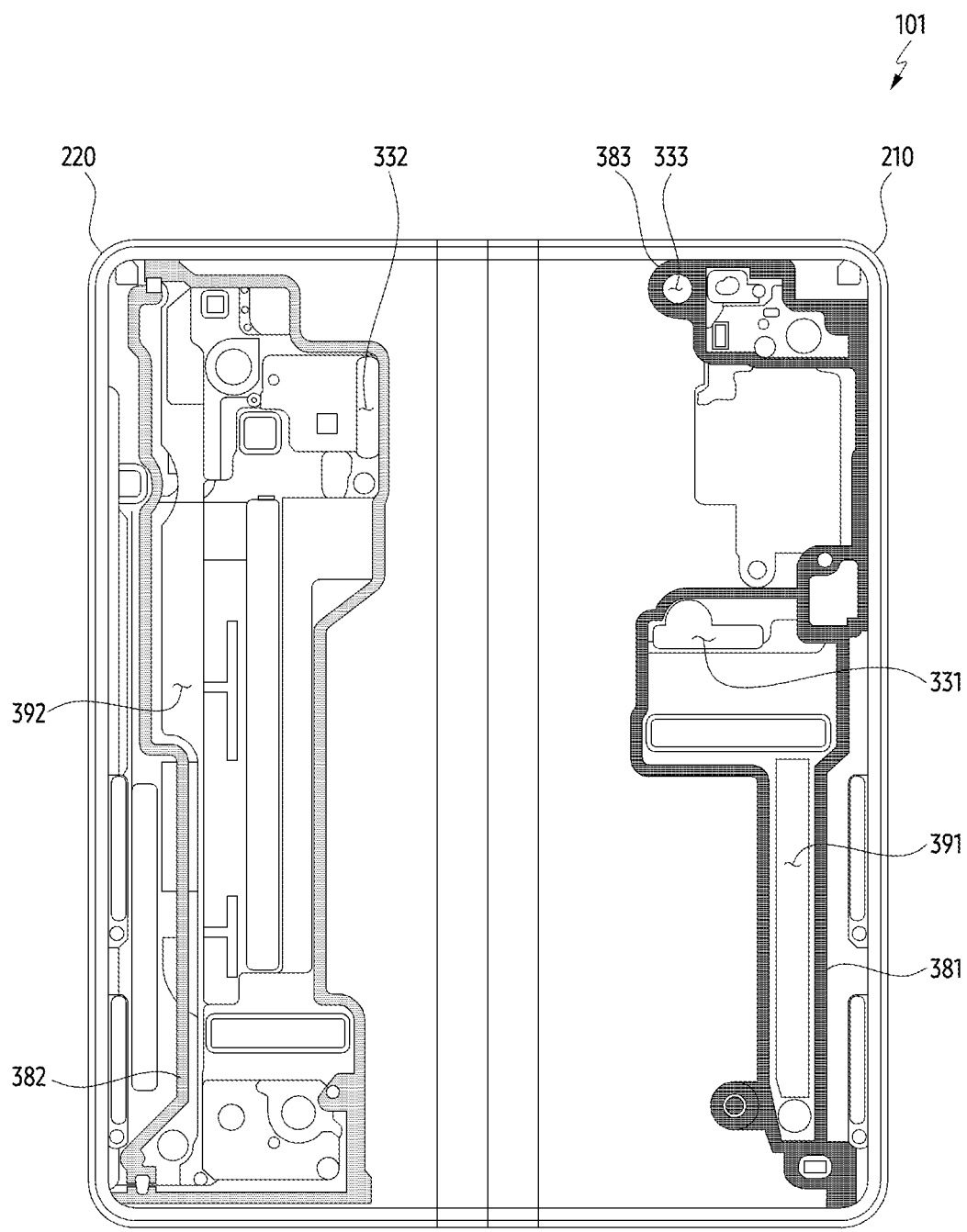
FIG. 3 is a diagram illustrating a rear surface of a side supporter of an electronic device according to various embodiments.

FIG. 3 is a diagram illustrating a rear surface of a side supporter of an electronic device according to various embodiments.

A first waterproof adhesive 381 may be applied to a first surface (e.g., a first surface 211 of FIG. 2A) of a first housing 210. A second waterproof adhesive 382 may be applied to a second surface (e.g., a second surface 212 of FIG. 2A) of a second housing 220. The first waterproof adhesive 381 and the second waterproof adhesive 382 may prevent and/or reduce moisture from flowing in a gap between a hinge structure 260 and a hinge cover 265, the first housing 210 and the second housing 220 from being transferred to an electronic component mounted inside the electronic device 101. Each of the first waterproof adhesive 381 and the second waterproof adhesive 382 may be disposed on the first surface 211 and the second surface 212 as a closed curve.

The first waterproof adhesive 381 may form a first waterproof area 391 that blocks the inflow of moisture. For example, the first waterproof adhesive 381 may prevent and/or reduce moisture that introduced through the gap between the hinge cover 265 and the hinge structure 260 and the gap between the hinge structure 260 and the hinge cover 265, and reached the first surface 211 from being transferred to components such as a printed circuit board and/or a processor disposed on the second surface 212 by surrounding the area where the opening 331 which penetrates the first housing 210 and connects the first surface 211 and the second surface (e.g., the second surface 212 of FIG. 2A)) is located.

The second waterproof adhesive 382 may form a second waterproof area 392 in which the inflow of moisture is blocked by the second waterproof adhesive 382. For example, the second waterproof adhesive 382 may prevent and/or reduce moisture located on a third surface 221 from being transferred to components such as a printed circuit board and/or a battery disposed on a fourth surface 222 by surrounding the area where the opening 332 connecting the third surface 221 and the fourth surface 222 by penetrating the second housing 220 is located.

According to an embodiment, the first housing 210 may further include a third waterproof adhesive 383 applied on the first surface 211. The third waterproof adhesive 383 may surround around an opening 333 that transmits light to a camera (not illustrated) disposed under a flexible display (e.g., a flexible display 230 of FIG. 2). The opening 333 for transmitting light to the camera may penetrate the first surface 211 in contact with the flexible display 230 and the second surface 212 facing the first surface 211. Moisture that is introduced from the outside and located on the first surface 211 may be introduced into components located on the second surface 212 through the gap between the opening 333 and the camera. The third waterproof adhesive 383 may prevent and/or reduce external moisture introduced through the gap between the hinge structure 260 and the first housing 210 and the second housing 220 from flowing into the electronic device along the gap between the camera and the opening 333. The waterproof adhesive may further include a sealing member (e.g., seal) such as a waterproof adhesive, a rubber, and a waterproof resin (e.g., CIPG, curled in placed gasket) to block the flow of moisture through the openings formed on the support surfaces of the first housing 210 and the second housing 220 as well as the first waterproof adhesive 381, the second waterproof adhesive 382, and the third waterproof adhesive 383. For example, the second housing 220 may further include a waterproof adhesive forming a closed curve along the edge of the fourth surface 222 on the fourth surface 222 facing the display panel 235.

Figure 4A:
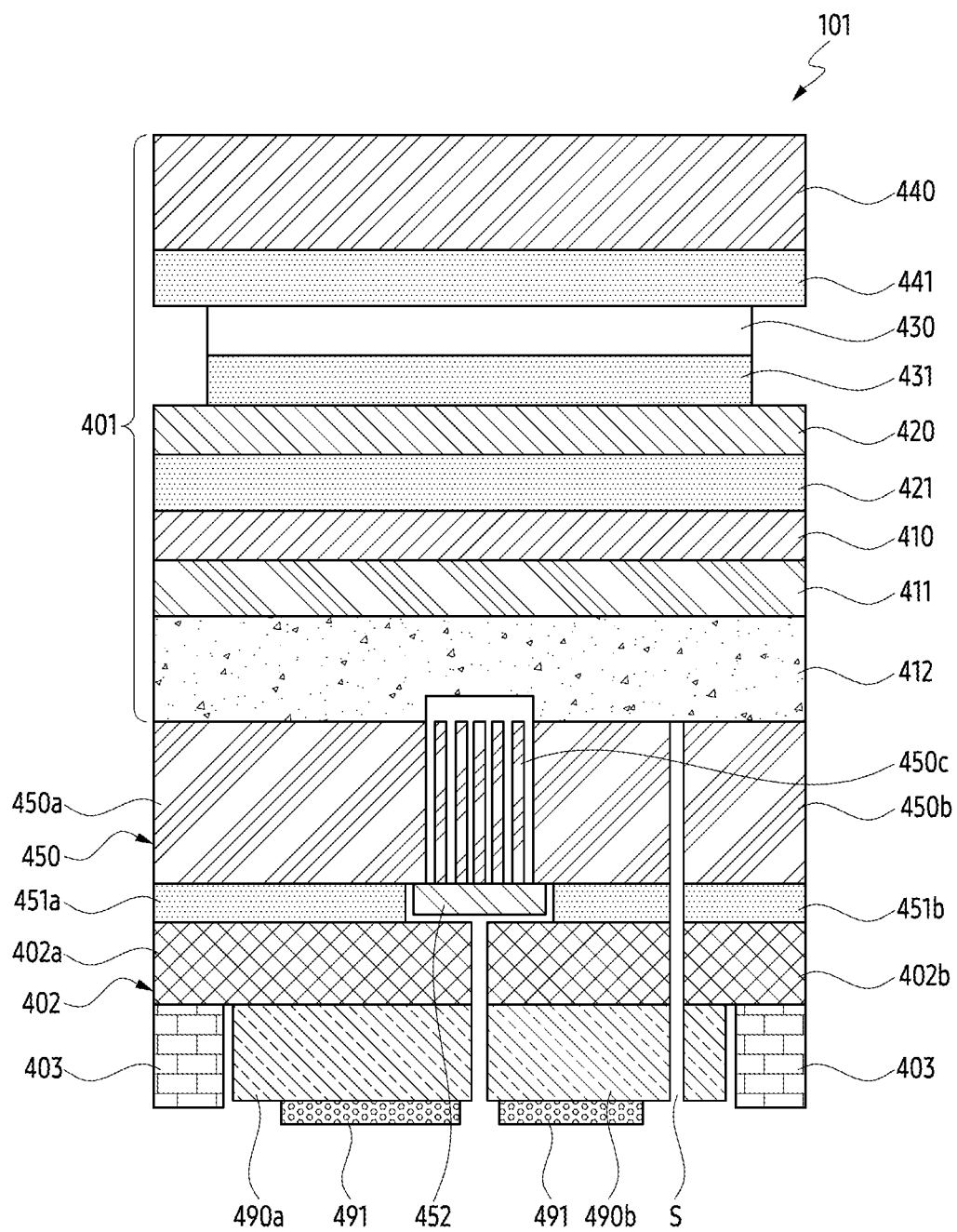
FIG. 4A is a cross-sectional view including a foldable display panel and an input module of an electronic device according to various embodiments.

FIG. 4A is a cross-sectional view including a foldable display panel and an input module of an electronic device according to various embodiments.

Referring to FIG. 4A, an electronic device 101 may include a flexible display 401 (e.g., the flexible display 230 in FIG. 2A), an input module 402, a support plate 450, and a supporter 490.

According to an embodiment, the flexible display 401 may include a display panel 410, a window 430, a first layer 440, a second layer 420, a first protective layer 411, a second protective layer 412 and a support plate 450.

According to an embodiment, the window 430 may be disposed on a surface of the display panel 410 facing the outside of the electronic device 101 to protect the display panel 410. The window 430 may be configured to provide visual information by transmitting light emitted from the display panel 410 to the outside. The flexible display 401 may further include the first layer 440, the window 430, the second layer 420, and adhesive layers 441, 431, and 421 disposed between the first layer 440, the window 430, and the second layer 420. According to an embodiment, the first layer 440, the window 430, and the second layer 420 may include a transparent portion. For example, the first layer 440, the window 430, and the second layer 420 may include the transparent portion so as to transmit light emitted from the display panel 410 to the outside. The first layer 440, the window 430, and/or the second layer 420 may include a polymer material or a glass material. For example, the window 430 may secure overall rigidity of layers disposed on a surface of the display panel 410 facing the outside of the electronic device 101 by being formed of the glass material. The window 430 may include an ultra-thin glass (UTG) formed of a thin film glass material. For another example, the window 430 may include the polymer material such as polyimide (PI).

The first layer 440 and/or the second layer 420 may include a thin film formed of polyimide (PI) or PET.

According to an embodiment, the first layer 440 may be a layer for protecting the window 430. The first layer 440 may be referred to as a protective film. The first layer 440 may include the polymer material such as PET. The adhesive layer 441 disposed between the first layer 440 and the window 430 may be formed to have a lower viscosity or a thinner thickness than other adhesive layers 431 and 421. In case that replacement or removal of the first layer 440 is needed, in order to remove the first layer 440, the adhesive layer 441 disposed between the first layer 440 and the window 430 may be configured to have a lower adhesive force than other adhesive layers 431 and 421.

The second layer 420 may be a layer for protecting the display panel 410. The second layer 420 may include a protective layer or a polarization layer made of the polymer material such as PET. The second layer 420 may be configured as the polarization layer or the protective layer depending on the display panel 410. For example, the second layer 420 may be implemented as the protective layer in case that the display panel 410 includes a luminous body emitting white light and a color filter. For example, in case that the display panel 410 is a white organic light emitting diode (WOLED) that emits white light, for implementation of color, the color filter may be included for each pixel, and a polarizing plate may be omitted. In case that the display panel 410 includes the polarization layer or in case that the polarizing plate may be omitted, the second layer 420 may be referred to as the protective layer. In case that the display panel 410 needs the polarization layer, but the polarization layer is not included on the pixels of the display panel 410, the second layer 420 may be referred to as the polarization layer.

An additional layer may be further included according to the need of the protective layer. The additional layer may be formed of a material having a higher rigidity than that of the first layer 440 and the second layer 420. The additional layer may have a scratch-resistance properties. The additional layer may be disposed at various positions in the first layer 440 and the flexible display 401. For example, the additional layer may be disposed on the first layer 440, disposed between the first layer 440 and the window 430, or disposed between the window 430 and the second layer 420. The additional layer may be disposed between the first layer 440 and the window 430 to surround a side surface of the first layer 440 or a side surface of the window 430. The additional layer may be disposed between the second layer 420 and the window 430 to surround a side surface of the second layer 420 or a side surface of the window 430. The additional layer may be a film stacked on a surface of the first layer 440, the second layer 420, or the window 430. The additional layer may be formed by a coating liquid applied to a surface of the first layer 440, the second layer 420 or the window 430.

According to an embodiment, the additional layer may include an anti-reflection (AR) coating, a low reflection (LR) coating, a shatter proof (SP) coating, an anti-fingerprint (AF) coating, and the like.

According to an embodiment, the adhesive layers 441, 442, and 443 may be transparent adhesive layers capable of transmitting light. The adhesive layers 441, 442, and 443 may include a pressure sensitive adhesive (PSA) or an optical clear adhesive (OCA).

According to an embodiment, the flexible display 401 may further include protective layers disposed on the other surface of the display panel 410 (e.g., the surface facing the support plate 450). The protective layers may include a first protective layer 411 and/or a second protective layer 412.

According to an embodiment, the first protective layer 411 may be disposed on the other surface of the display panel 410. For example, the window 430 may be disposed on a surface of the display panel 410, and the first protective layer 411 may be disposed on the other surface opposite to a surface of the display panel 410. The first protective layer 411 may be attached to the other surface of the display panel 410 by an adhesive member or an adhesive adhesive. The first protective layer 411 may be a film for protecting the display panel 410. The first protective layer 411 may be formed of the polymer material such as PET.

The second protective layer 412 may be in contact with the other surface of the first protective layer 411 opposite to a surface of the first protective layer 411 contacting the display panel 410. For example, the first protective layer 411 may be disposed between the display panel 410 and the second protective layer 412. The second protective layer 412 may include a layer (e.g., an embo layer) to block light generated from the display panel 410 or incident light from the outside, and/or a layer (e.g., a cushion layer or a sponge layer) to protect the display panel 410 from external impacts. The second protective layer 412 may be formed of the polymer material and may include the adhesive member. The adhesive member may be a pressure sensitive adhesive (PSA).

According to an embodiment, the first layer 440, the second layer 420, the window 430, the display panel 410, the first protective layer 411 and the second protective layer 412 may be disposed in the first display area 231 (e.g., the first display area 231 of FIG. 2A), the second display area 232 (e.g., the second display area 232 of FIG. 2A), and the third display area 233 (e.g., the third display area 233 of FIG. 2A) of the foldable display 401. The first protective layer 411 and the second protective layer 412 may support the display panel 410 while protecting the other surface (e.g., the lower portion) of the display panel 410. For example, the first protective layer 411 and the second protective layer 412 may protect the display panel 410 from the support plate 450 having rigidity.

According to an embodiment, the support plate 450 may support the display panel 410, the window 430, the first layer 440, and the second layer 420. The support plate 450 may include a first rigid area 450a supporting a first display area 231, a second rigid area 450b supporting a second display area 232, and a flexible area 450c supporting a third display area 233 of the foldable display 401. The support plate 450 may be disposed between the display panel 410 and the input module 402. The support plate 450 for supporting the display panel 410 may be formed of a material having rigidity. For example, the support plate 450 may include a metal having rigidity or carbon fiber reinforced plastic (CFRP).

The first rigid area 450a may be formed of the material having rigidity to support the foldable display 401 or the first display area 231 of the display panel 410. The second rigid area 450b may be formed of the material having rigidity to support the foldable display 401 or the second display area 232 of the display panel 410.

According to an embodiment, the flexible area 450c may be disposed between the first rigid area 450a and the second rigid area 450b. The flexible area 450c may support the third display area 233 of the foldable display 401. Since the third display area 233 of the foldable display 401 is configured to be deformed according to the state of the electronic device 101, the flexible area 450c of the support plate 450 may include a deformable structure. For example, the flexible area 450c of the support plate 450 may include openings or spaces separated from each other formed in a parallel direction from the boundary between the first rigid area 450a and the flexible area 450c. For another example, the flexible area 450c may include a recess formed in a direction parallel to the boundary, instead of an opening. For another example, the flexible area 450c may include the mixed recess and the opening. The flexible area 450c of the support plate 450 may be formed to be segmented from each other by the openings or the spaces separated from each other. The segmented portions of the flexible area 450c may be connected to be deformable based on the state of the electronic device 101. The segmented portions of the support plate 450 may be deformed according to the state of the electronic device 101 to guide the shape of the third display area 250c. The first rigid area 450a and the second rigid area 450b may be formed of one member differently from the flexible area 450c. For example, the first rigid area 450a and the second rigid area 450b may not include the openings or the spaces separated form each other of the flexible area 450c.

According to an embodiment, a protective member 452 may be disposed under the flexible area 450c. The protective member 452 may be formed of a material that has elasticity and is deformable. For example, the protective member 452 may include a thermoplastic polyurethane (TPU).

According to an embodiment, adhesive members 451a and 451b may be disposed under the first rigid area 450a and the second rigid area 450b. The adhesive members 451a and 451b may couple the support plate 450 and the input module 402.

According to an embodiment, the input module 402 may detect the approach of an external object such as a stylus pen. The input module 402 may perform electromagnetic interaction with an external object through signal patterns forming a loop. For example, the stylus pen and signal patterns of the input module 402 may identify a location of the stylus pen using electromagnetic resonance. For example, a stylus pen approaching a magnetic field formed by power supplied to signal patterns may generate a wireless communication signal in a designated frequency band recognizable by the input module 402. The input module 402 may identify the location of the stylus pen by transmitting data related to the location and intensity of the received signal to a processor (e.g., a processor 120 of FIG. 1).

According to an embodiment, the input module 402 may be configured as two separate modules corresponding to the first display area 231 and the second display area 232. The input module 402 may cover the entire display area of the foldable display 401. For example, a first input module 402*a* among separated modules may be disposed in a part of the first display area 231 and the third display area 233, and a second input module 402*b* among separated modules may be disposed in the remaining part of the second display area 232 and the third display area 233.

According to an embodiment, the input module 402 may be supported by the supporter 490. The supporter 490 may include a first supporter 490*a* and a second supporter 490*b*. The supporter 490 may support the display panel 410 and the input module 402. The supporter 490 may include a metal having rigidity. The supporter 490 may be attached to a part of the housing or integrally formed. For example, the first supporter 490*a* may be attached to or integrally formed with the first housing (e.g., the first housing 210 of FIG. 2A) or the structure of the first housing 210. The second supporter 490*b* may be attached to or integrally formed with the second housing (e.g., the second housing 220 of FIG. 2A) or the structure of the second housing 220.

According to an embodiment, the electronic device 101 may further include a heat dissipation member 491 and an electromagnetic shielding member 403. The heat dissipation member 491 may radiate heat generated from the display panel 410 and the input module 402 to the outside of the electronic device 101 through the housing 210 or 220. The shielding member 403 may shield the magnetic field generated by the input module 402. The shielding member 403 may include an amorphous ribbon sheet (ARS) for shielding the magnetic field.

According to an embodiment, layers and/or members disposed under the display panel 410 may include a slit S spaced apart from one edge of the display panel 410. The slit S may be formed to facilitate bending of a flexible board extending from the edge of the display 401. On the flexible board, a display driver IC (DDI) may be disposed. According to an embodiment, the flexible board may be extended from one edge of the display panel 410 and may be bent into an inner surface of the second housing 220.

Figure 4B:
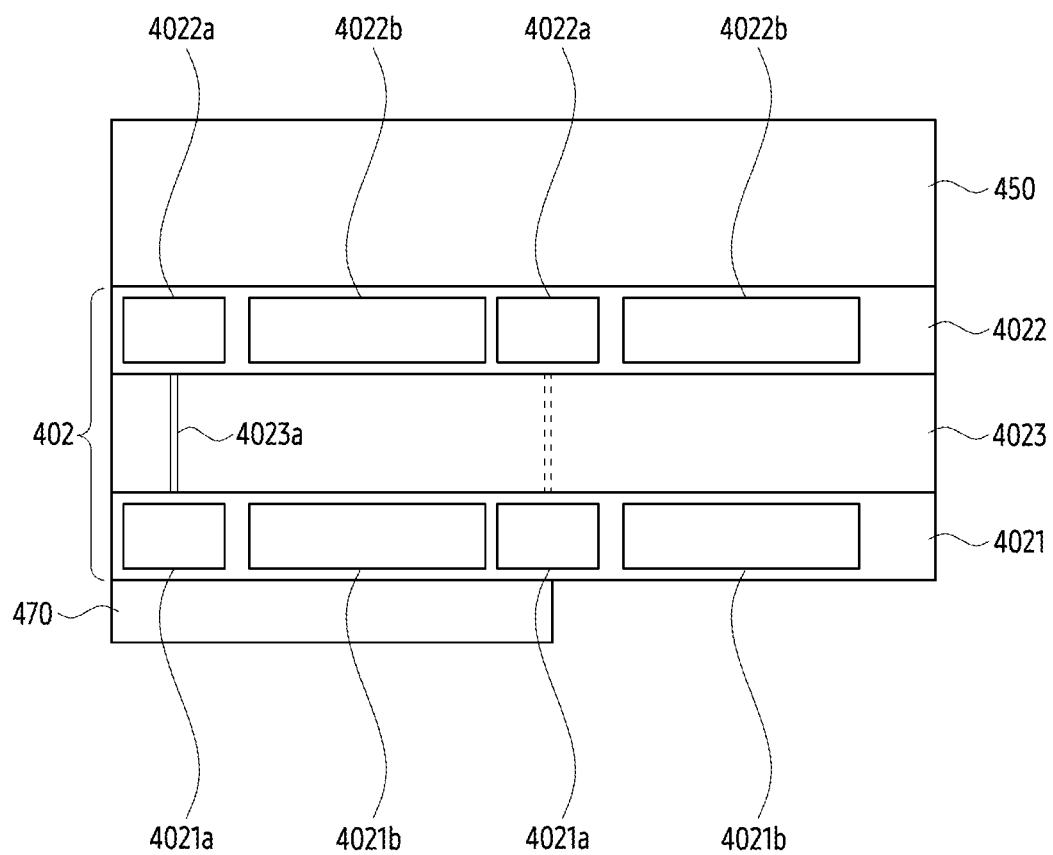
FIG. 4B is a diagram illustrating an example disposition of an input module and a support plate according to various embodiments.

FIG. 4B is a diagram illustrating a disposition of an input module and a support plate according to various embodiments.

Referring to FIG. 4B, an electronic device 101 may include an input module 402, a support plate 450, and a waterproof adhesive 470.

According to an embodiment, the input module 402 may be disposed between a display (e.g., a display 401 of FIG. 4A), a first housing (e.g., a first housing 210 of FIG. 2A), and a second housing (e.g., a second housing 220 of FIG. 2A). For example, a part of the input module 402 may be supported by the first housing 210 or a first supporter (e.g., a first supporter 490*a* of FIG. 4A) supported by the first housing 210. The remaining part of the input module 402 may be supported by the second housing 220 or a second supporter (e.g., a second supporter 490*b* of FIG. 4B) supported by the second housing 220.

According to an embodiment, the input module 402 may include a plurality of layers. For example, the input module 402 may include a first pattern layer 4021, a second pattern layer 4022, and a non-conductive layer 4023. Each of the first pattern layer 4021 and the second pattern layer 4022 may include conductive patterns.

According to an embodiment, the first pattern layer 4021 may include first signal patterns 4021*a* and first dummy patterns 4021*b*. The first signal patterns 4021*a* may be disposed with intervals to form a loop. For example, each of the first signal patterns 4021*a* may be disposed to be spaced apart from each other. For example, each of the first signal patterns 4021*a* may be spaced apart in a first direction and may be extended in a second direction perpendicular to the first direction. Intervals between the first signal patterns 4021*a* may not be the same. However, it is not limited thereto, and the intervals between the first signal patterns 4021*a* may be disposed to be the same in some sections. The first signal patterns 4021*a* disposed in the first pattern layer 4021 may be conductive patterns, and the first signal patterns 4021*a* may be surrounded by the first pattern layer 4021. For another example, the first signal patterns 4021*a* may be disposed on a non-conductive layer (e.g., a coverlay), and another non-conductive layer different from the non-conductive layer may be disposed on the first signal patterns 4021*a*. The non-conductive layer and the other non-conductive layer may surround the first signal patterns 4021*a*.

According to an embodiment, in case that the first pattern layer 4021 includes only the first signal patterns 4021*a*, a thickness of the first pattern layer 4021 in an area where the first signal patterns 4021*a* are disposed may be different from a thickness of the first pattern layer 4021 in an area where the first signal patterns 4021*a* are not disposed. Due to the different thicknesses of the first pattern layer 4021, it may be difficult for the first pattern layer 4021 to secure a flat surface. Due to the occurrence of a step difference between an area in which the first pattern layer 4021 is disposed and an area in which the first pattern layer 4021 is not disposed, a pattern due to the step difference of the input module 402 may be visually recognized from the outside of the electronic device 101. Due to the occurrence of the step difference, it may be difficult to attach the waterproof adhesive 470. In order to secure waterproof performance and prevent and/or reduce pattern visual recognition from the outside, the first pattern layer 4021 and the second pattern layer 4022 may include dummy patterns 4021*b* and 4022*b* between the signal patterns 4021*a* and 4022*a*.

According to an embodiment, the first dummy patterns 4021*b* may be disposed in a space between the first signal patterns 4021*a*. For example, the first dummy patterns 4021*a* may be disposed in the remaining area of the first pattern layer 4021 except for one area of the first pattern layer 4021 occupied by the first signal patterns 4021*a*. The first pattern layer 4021 may secure a flat surface by disposing the first dummy patterns 4021*b* disposed in the space between the first signal patterns 4021*a* and the first signal patterns 4021*a*.

According to an embodiment, the first dummy patterns 4021*b* may be electrically separated from the first signal patterns 4021*a*. Current may be applied to the first signal patterns 4021*a* to generate a magnetic field for sensing the approach of an external object (e.g., a stylus pen), but current may not flow to the first dummy patterns 4021*b*.

According to an embodiment, the second pattern layer 4022 may include second signal patterns 4022a and second dummy patterns 4022b. Each of the second signal patterns 4022a may be disposed to be spaced apart from each other. For example, each of the second signal patterns 4022a may be spaced apart from each other in the second direction and may be extended in a first direction perpendicular to the second direction. For example, the first signal patterns 4021a and the second signal patterns 4021b may be perpendicular to each other.

According to an embodiment, the intervals between the second signal patterns 4022a may not be the same. However, it is not limited thereto, and intervals between the second signal patterns 4022a may be disposed to be the same in some sections. The second signal patterns 4022a disposed in the second pattern layer 4022 may be conductive patterns, and the second signal patterns 4022a may be surrounded by the second pattern layer 4022. For another example, the second signal patterns 4022a may be disposed on the non-conductive layer, and another non-conductive layer different from the non-conductive layer may be disposed on the second signal patterns 4022a. The second signal patterns 4022a may be surrounded by the non-conductive layer and the other non-conductive layer.

According to an embodiment, in case that the second pattern layer 4022 includes only the second signal patterns 4022a, a thickness of the second pattern layer 4022 in the area where the second signal patterns 4022a are disposed may be different from a thickness of the second pattern layer 4022 in the area where the second signal patterns 4022a are not disposed.

According to an embodiment, the second dummy patterns 4022b may be disposed in a space between the second signal patterns 4022a. For example, the second dummy patterns 4022a may be disposed in the remaining area of the second pattern layer 4022 except for one area of the second pattern layer 4022 occupied by the second signal patterns 4022a. The second pattern layer 4022 may secure a flat surface by disposing the second dummy patterns 4022b disposed in the space between the second signal patterns 4022a and the second signal patterns 4022a.

According to an embodiment, the second dummy patterns 4022b may be electrically separated from the second signal patterns 4022a. Current may be applied to the second signal patterns 4022a to generate a magnetic field for sensing the approach of the external object (e.g., a stylus pen), but current may not flow to the second dummy patterns 4022b.

According to an embodiment, the non-conductive layer 4023 may be disposed between the first pattern layer 4021 and the second pattern layer 4022. The non-conductive layer 4023 may include at least one conductive via 4023a that electrically connects the first signal patterns 4021a of the first pattern layer 4021 and the second signal patterns 4022a of the second pattern layer 4022. The first signal patterns 4021a and the second signal patterns 4021b connected through at least one conductive via 4023a may detect approach or contact of the external object (e.g., a stylus pen). For example, current flowing through the first signal patterns 4021a and the second signal patterns 4021b may form a magnetic field to induce a current to a coil included in the stylus pen. The stylus pen may transmit a wireless signal to the input module 402 based on the induced current. The wireless signal transmitted from the stylus pen may be received through the input module 402. However, it is not limited thereto, and the input module 402 may detect the external object through a change in capacitance of the first signal patterns 4021a and the second signal patterns 4021b.

According to an embodiment, a surface of the input module 402 facing a foldable display (e.g., a foldable display 401 of FIG. 4A) may contact the support plate 450. The support plate 450 may support a foldable display panel 410. A part of the other surface opposite to the one surface of the input module 402 may be in contact with the waterproof adhesive 470. As described in FIG. 3, the waterproof adhesive 470 may be disposed between the display panel and the side supporter to block moisture flowing into the electronic device.

Figure 5A:
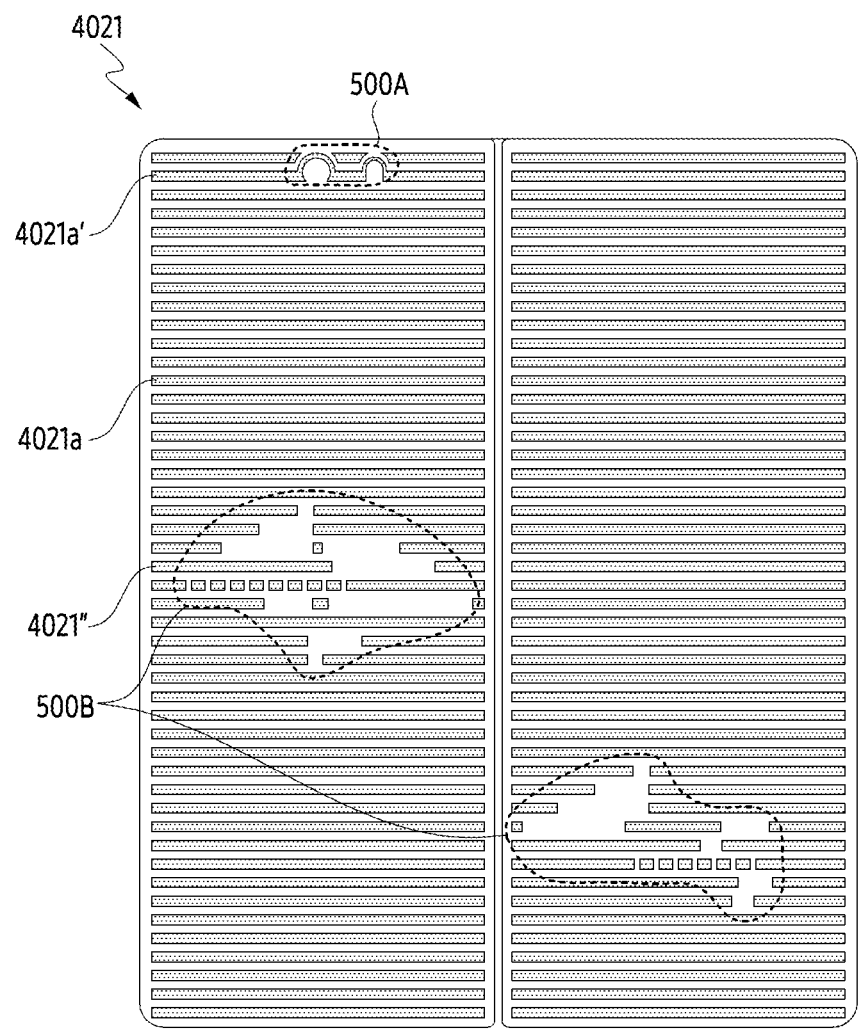
FIG. 5A is a diagram illustrating a first signal pattern included in a first pattern layer of an input module according to various embodiments.
Figure 5B:
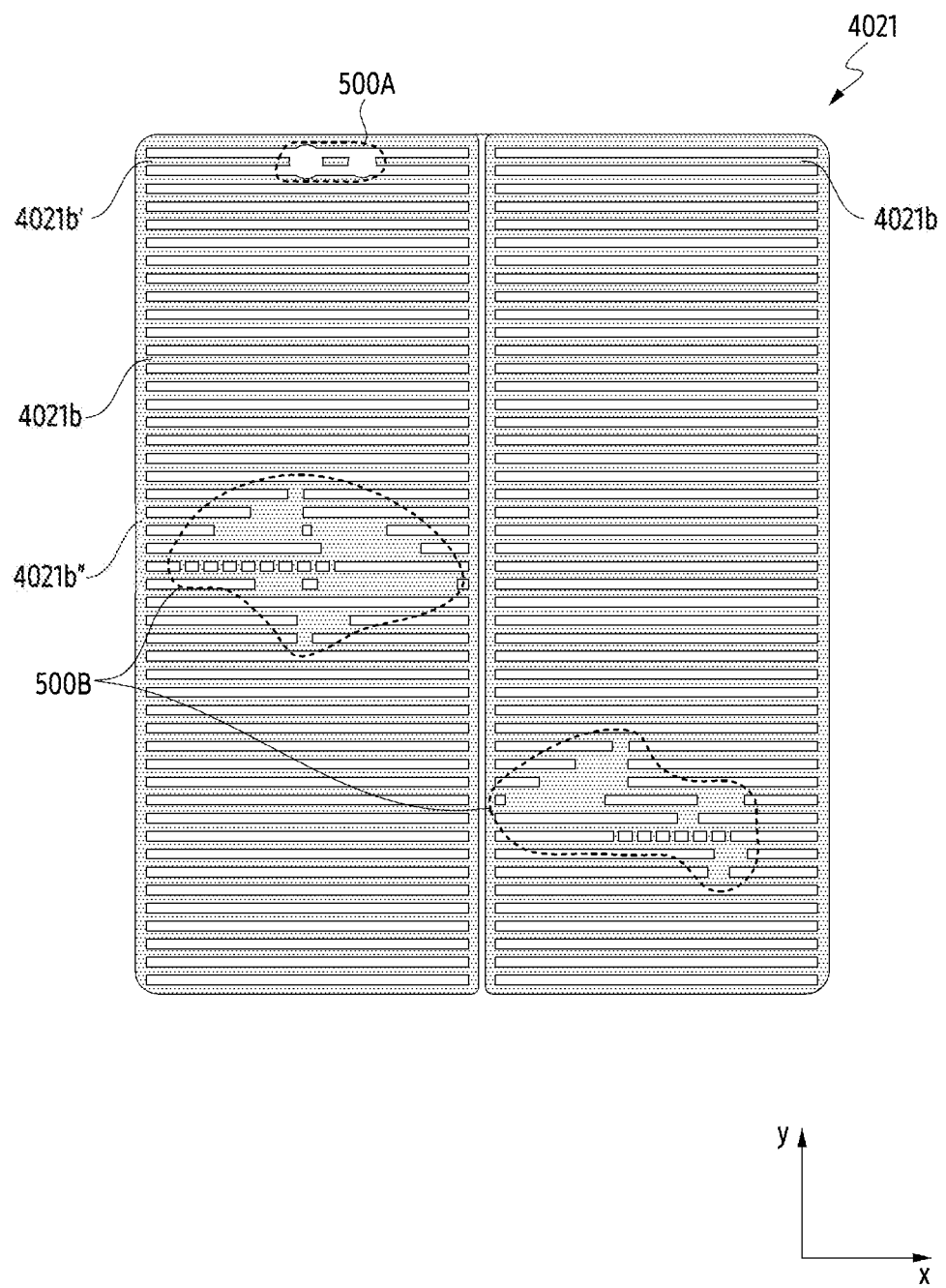
FIG. 5B is a diagram illustrating a first dummy pattern included in a first pattern layer of an input module according to various embodiments.

FIG. 5A is a diagram illustrating an example first signal pattern included in a first pattern layer of an input module according to various embodiments. FIG. 5B is a diagram illustrating an example first dummy pattern included in a first pattern layer of an input module according to various embodiments.

Referring to FIG. 5A, the first pattern layer 4021 may include first signal patterns 4021a.

According to an embodiment, the first signal patterns 4021a may be extended in a first direction (x-axis direction). The first signal patterns 4021a may be line segments substantially extending in the first direction (x-axis direction). For example, the first signal patterns 4021a may include a pattern having the line segment extending in the first direction and a pattern having a curve. For example, the first signal patterns 4021a may include a pattern having the line segment extending in the first direction and a pattern having the curve. According to an embodiment, among the first signal patterns 4021a, a first signal pattern 4021a' passing through an area 500A in which a front camera is disposed may include a curve extending along an edge of a camera hole included in the area 500A. Another first signal pattern 4021a" passing through an area 500B among the first signal patterns 4021a may have a different thickness in the area 500B. In the area 500B, the thickness of another first signal pattern 4021a" may be formed differently according to a mechanical shape of a supporter of a housing.

According to an embodiment, the first signal patterns 4021a may be spaced apart from each other by substantially the same interval. The first signal patterns 4021a may be spaced apart from each other by different intervals in some areas. An interval between one first signal pattern 4021a' disposed in the area 500A and other pattern and an interval between the first signal pattern 4021a" disposed in the area 500B and other patterns may be different from each other.

Referring to FIG. 5B, the first pattern layer 4021 may include the first dummy pattern 4021b.

According to an embodiment, the first dummy patterns 4021b may be extended in the first direction (x-axis direction). The first dummy patterns 4021b may be disposed in a space between the first signal patterns 4021a.

According to an embodiment, the first dummy pattern 4021b' disposed in the area 500A in which the front camera is disposed among the first dummy patterns 4021b may be extended to the area 500A in which the camera hole is disposed in the first direction. For example, the first dummy pattern 4021b' disposed in the area 500A may have a length different from that of the other first dummy patterns 4021b. For example, the first dummy patterns 4021b may be cut off in the area 500A in which the camera hole is disposed.

According to an embodiment, as the thickness of the first signal pattern 4021a" disposed in the area 500B is different, another first dummy pattern 4021b" disposed in the area 500B may also have a thickness different from that of the first dummy patterns 4021b. For example, in the area 500b, since the thicknesses of the first signal patterns 4021 are different, the thicknesses of the spaces between the first signal patterns 4021 may also be different. The first dummy patterns 4021b disposed in the space may also have different thicknesses.

Figure 6A:
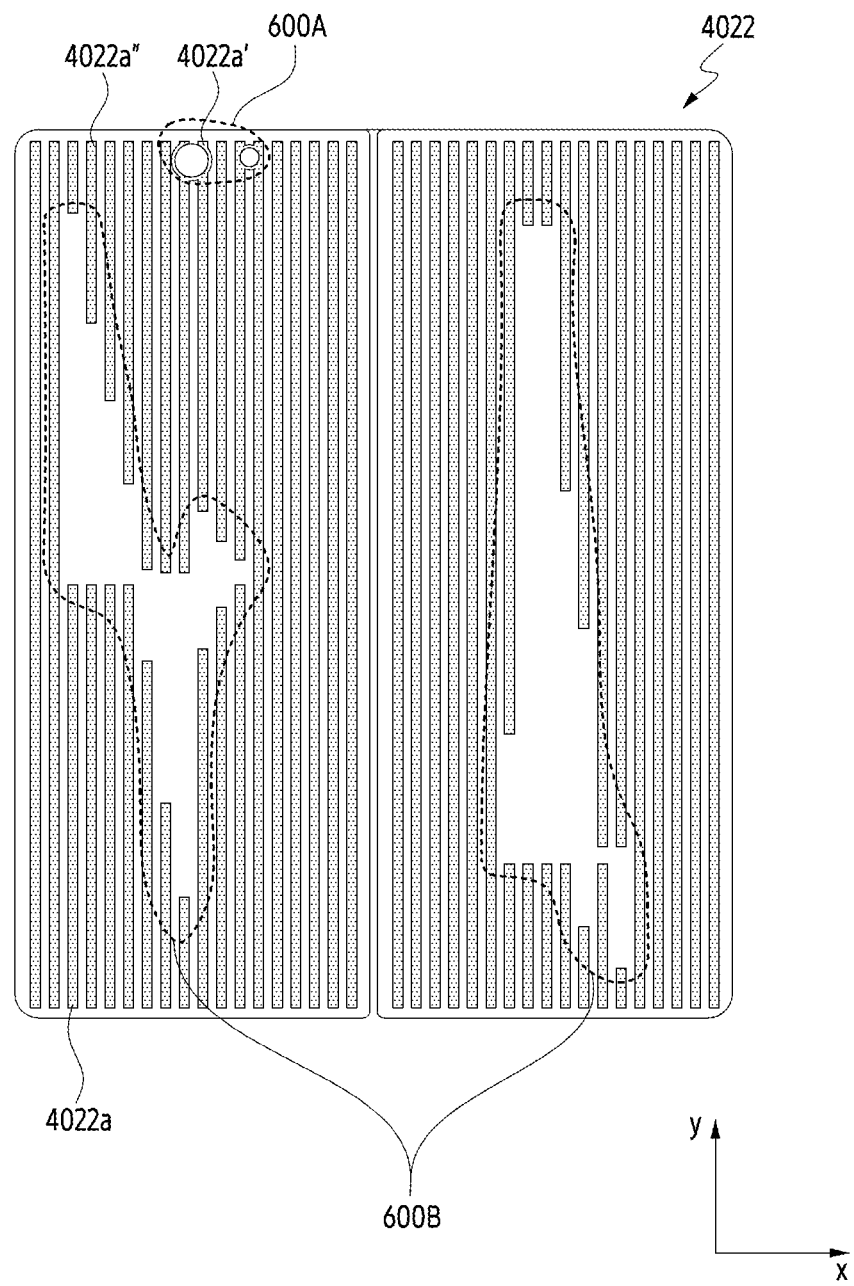
FIG. 6A is a diagram illustrating a second signal pattern included in a second pattern layer of an input module according to various embodiments.
Figure 6B:
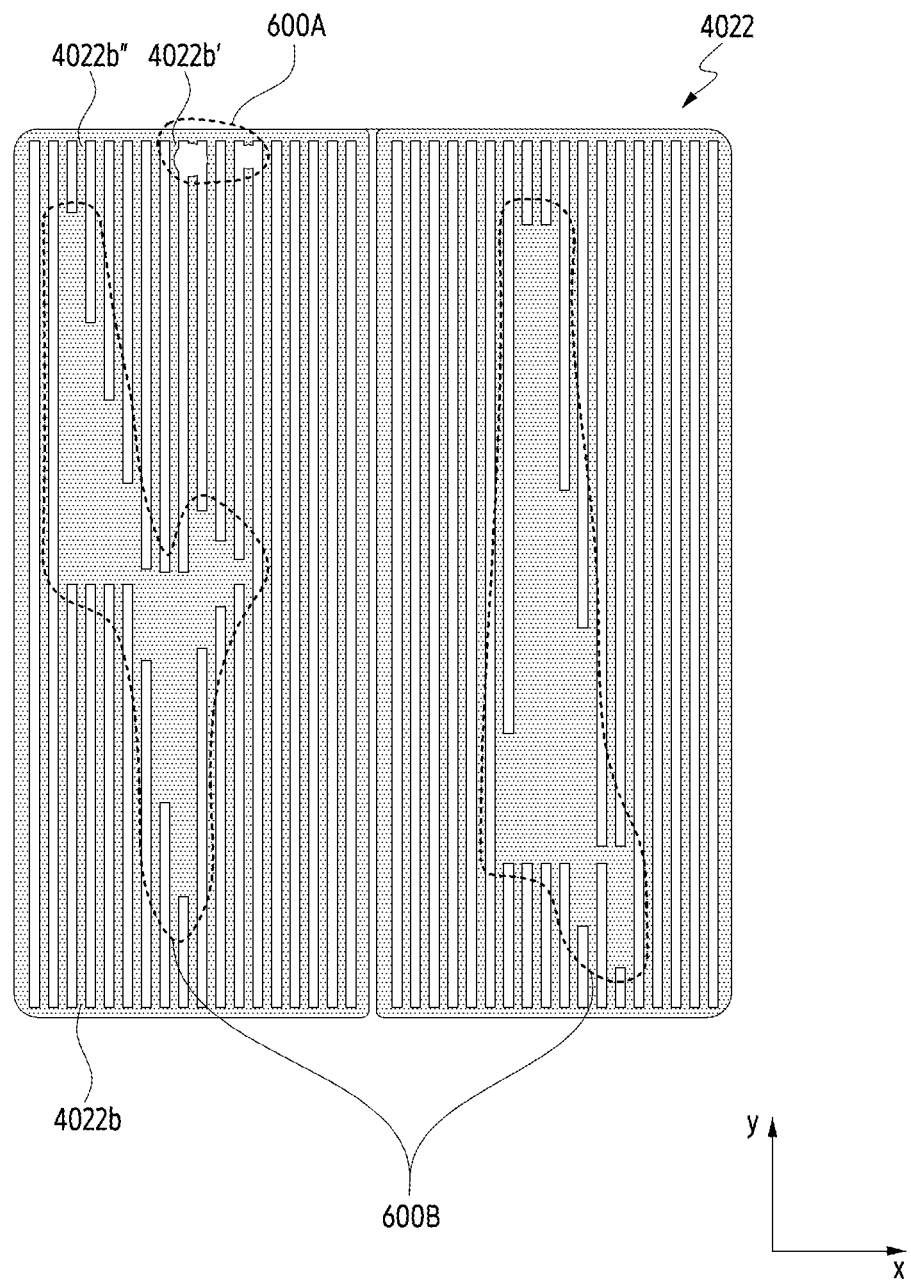
FIG. 6B is a diagram illustrating a second dummy pattern included in a second pattern layer of an input module according to various embodiments.

FIG. 6A is a diagram illustrating an example second signal pattern included in a second pattern layer of an input module according to various embodiments. FIG. 6B is a diagram illustrating an example second dummy pattern included in a second pattern layer of an input module according to various embodiments.

Referring to FIG. 6A, the second pattern layer 4022 may include second signal patterns 4022a.

According to an embodiment, the second signal patterns 4022a may be extended in a second direction (y-axis direction). The second signal patterns 4022a may be perpendicular to the first signal patterns 4021a. For example, the first signal patterns 4021a may be extended in a first direction (x-axis direction), and the second signal patterns 4022a may be extended in the second direction (y-axis direction) perpendicular to the first direction (x-axis direction). The first signal patterns 4021a and the second signal patterns 4022a may be perpendicularly disposed to identify a location of a stylus pen, which is an external object.

The second signal patterns 4022a may be line segments extending substantially in the second direction (y-axis direction). For example, the second signal patterns 4022a may include a pattern having a line segment extending in the second direction (y-axis direction) and a pattern having a curve. According to an embodiment, among the second signal patterns 4022a, one second signal pattern 4022a' passing through an area 600A in which a front camera is disposed may include a curve extending along an edge of a camera hole included in the area 600A. Another second signal pattern 4022a" passing through an area 600B among the second signal patterns 4022a may have a different thickness or may be cut off in the area 600B. Depending on a mechanical shape of a supporter of the housing in the area 600B, a shape of another second signal pattern 4022a" may be different from a shape of the second signal pattern 4022a in the other area.

According to an embodiment, the second signal patterns 4022a may be spaced apart from each other at substantially the same interval. An interval between one second signal pattern 4022a' disposed in the area 600A and another pattern and an interval between the second signal pattern 4022a" disposed in the area 600B and the other patterns may be different.

Referring to FIG. 6B, the second pattern layer 4022 may include a second dummy pattern 4022b.

According to an embodiment, the second dummy patterns 4022b may be extended in the second direction (y-axis direction). The second dummy patterns 4022b may be disposed in a space between the second signal patterns 4022a.

According to an embodiment, among the second dummy patterns 4022b, a second dummy pattern 4022b' disposed in the area 600A in which the front camera is disposed may be extended to the area 600A in which the camera hole is disposed in the second direction (y-axis direction). For example, the second dummy pattern 4022b' disposed in the area 600A may have a different length from the other second dummy patterns 4022b. For example, the second dummy patterns 4022b may be cut off in the area 600A in which the camera hole is disposed.

According to an embodiment, as the shape of the second signal pattern 4022a" disposed in the area 600B is different, another second dummy pattern 4022b" disposed in the area 600B may also have a thickness different from that of the second dummy patterns 4022b. For example, in the area 600b, the shape of the second signal patterns 4022 may be different from the shape of the second signal patterns 4022 disposed in other areas, and the shape of the space between the second signal patterns 4022 may be different depending on the area. The second dummy patterns 4022b disposed in the space may also have different thicknesses.

The shapes of the patterns for each area of FIGS. 5A, 5B, 6A, and 6B are not limited to those illustrated, and may be formed in various shapes.

Figure 7A:
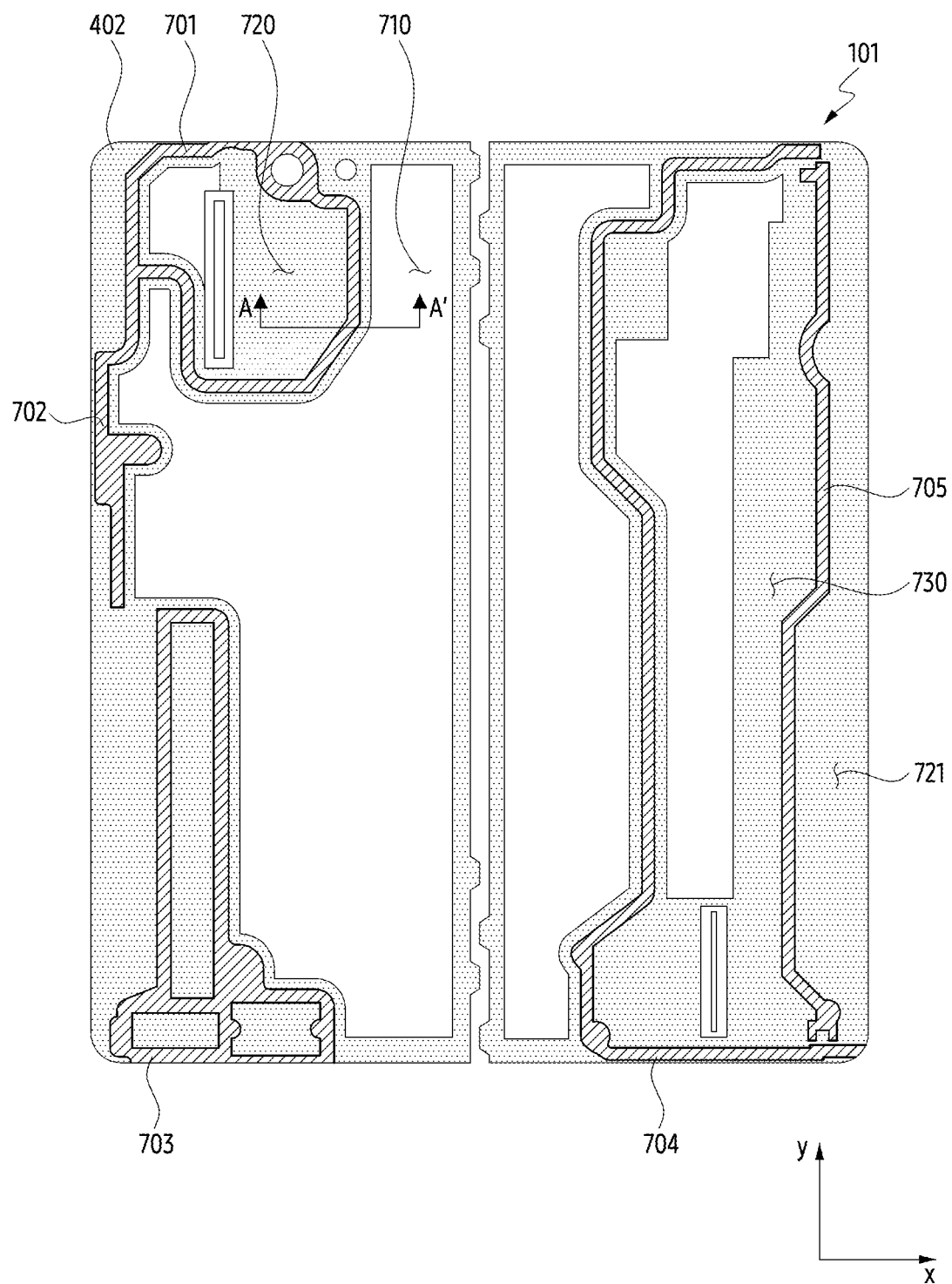
FIG. 7A is a diagram illustrating a removable area of a dummy pattern of an input module according to various embodiments.
Figure 7B:
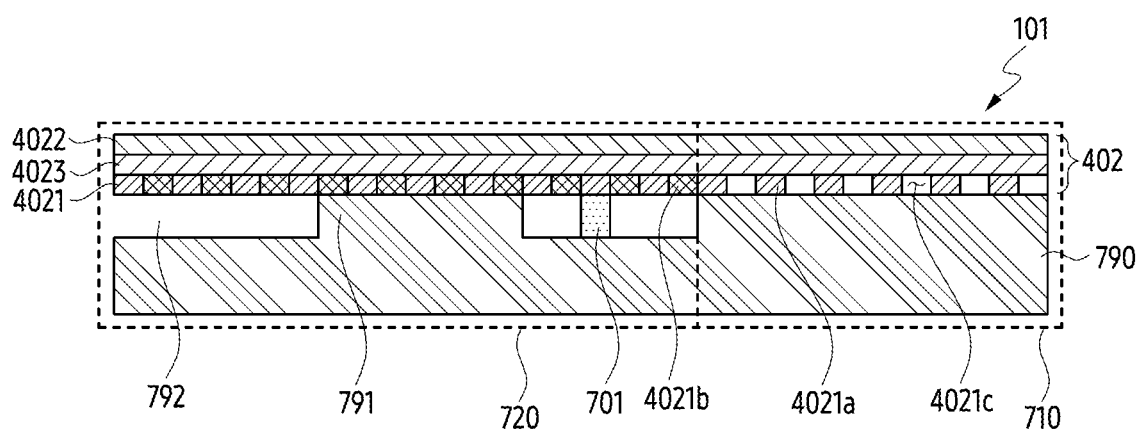
FIG. 7B is a cross-sectional view taken along line A-A' of FIG. 7A according to various embodiments.

FIG. 7A is a diagram illustrating an example removable area of a dummy pattern of an input module according to various embodiments. FIG. 7B is a cross-sectional view taken along line A-A' of FIG. 7A according to various embodiments.

Referring to FIGS. 7A and 7B, an electronic device 101 may include an input module 402 and waterproof adhesives 701, 702, 703, 704, and 705. The input module 402 may be disposed between the waterproof adhesives 701, 702, 703, 704, and 705 and a flexible display (e.g., a flexible display 401 of FIG. 4). The input module 402 may be disposed on a surface formed by a first housing (e.g., a first housing 210 of FIG. 2A) and a second housing (e.g., a second housing 220 of FIG. 2A).

The input module 402 may include a first pattern layer 4021, a second pattern layer 4022, and a non-conductive layer 4023. The first pattern layer 4021 may include first signal patterns 4021a and first dummy patterns 4021b. Each of the first signal patterns 4021a may be extended apart from each other, and may be connected to each other at ends of the first signal patterns 4021a.

According to an embodiment, some waterproof adhesives 701, 702, and 703 may be disposed on a surface of the input module 402 facing the first housing 210. The remaining waterproof adhesives 704 and 705 may be disposed on a surface of the input module facing the second housing 220.

According to an embodiment, the input module 402 may include a first area 710 in which the dummy patterns 4021b of the input module 402 are removable, and areas 720 and 730 in which the dummy patterns 4021b of the input module 402 are non-removable.

According to an embodiment, the first dummy patterns 4021b may not be disposed in the first area 710. In the first area 710, the supporter 790 may be formed to be structurally flat. The first area 710 may be an area that is less affected by the shapes (e.g., protrusion, groove, or opening) of the supporters 790 of the first housing 210 and the second housing 220 (e.g., the first supporter 270 or the second supporter 280 of FIG. 2A) even when the dummy patterns 4021b are removed. For example, when the first area 710 is disposed inside the electronic device 101, the first area 710 may be an area in which the influence of the mechanical structure is small. Since the influence of the mechanical structure is small in the first area 710, the flatness of a surface of the input module 402 facing the first housing 210 and the second housing 220 may be maintained. The first signal patterns 4021a disposed in the first area 710 may be disposed with intervals from each other. For example, in the first area 710, the first signal patterns 4021a may be disposed on the supporter 790, and the gaps 4021c may be formed between the first signal patterns 4021a.

According to an embodiment, the first dummy patterns 4021b may be disposed in a space between the first signal patterns 4021a. The first signal patterns 4021a and the first dummy patterns 4021b may be disposed in the second area 720 or the third area 730 in which planarization of the first pattern layer 4021 is needed.

According to an embodiment, the second area 720 may be an area that is greatly affected by structural factors of the supporters of the first housing 210 and the second housing 220. For example, the second area 720 may be an area in which the input module 402 faces the protrusion 791, the groove 792, or an opening (not illustrated), such as an area in which a structure for supporting an electronic component is formed in the supporter. In the second area 720, it may be difficult to remove the dummy patterns 4021b in order to maintain flatness due to the influence of the mechanical structure.

According to an embodiment, the third area 730 may be an area extended from an edge of the display 401 and on which a flexible substrate bent between the support members and the input module 402 is disposed. The flexible board may include DDI. Since it is essential for the flexible board to be waterproof, the flexible board may be disposed in a waterproof area, and dummy patterns 4021b may be maintained to secure waterproofing.

According to an embodiment, an area in which the waterproof adhesives 701, 702, 703, 704, and 705 are disposed may be included in an area in which the dummy patterns 4021b may be maintained. The waterproof adhesives 701, 702, 703, 704, and 705 may increase adhesion to the surface formed by the first housing 210 or the second housing 220 and may prevent and/or reduce moisture from being maintained in a flat area where the dummy patterns 4021b are included.

According to an embodiment, in an area corresponding to the edges of the first housing 210 and the edges of the second housing 220, the input module 402 may include dummy patterns 4021b. Edges of the first housing 210 and the second housing 220 forming the side surfaces of the electronic device 101 may be vulnerable to external impact, and thus dummy patterns 4021b may be disposed in an area of the input module 402 corresponding to the edges of the first housing 210 and the edges of the second housing 220.

According to the above-described example, by removing the dummy patterns in the removable area of the dummy pattern, the weight of the input module 402 may be reduced. The removable area of the dummy pattern is an area with less influence of the surrounding structure, such as an area supported by the flat structure, and the display 401 may be kept flat even when the dummy pattern is removed.

Figure 8:
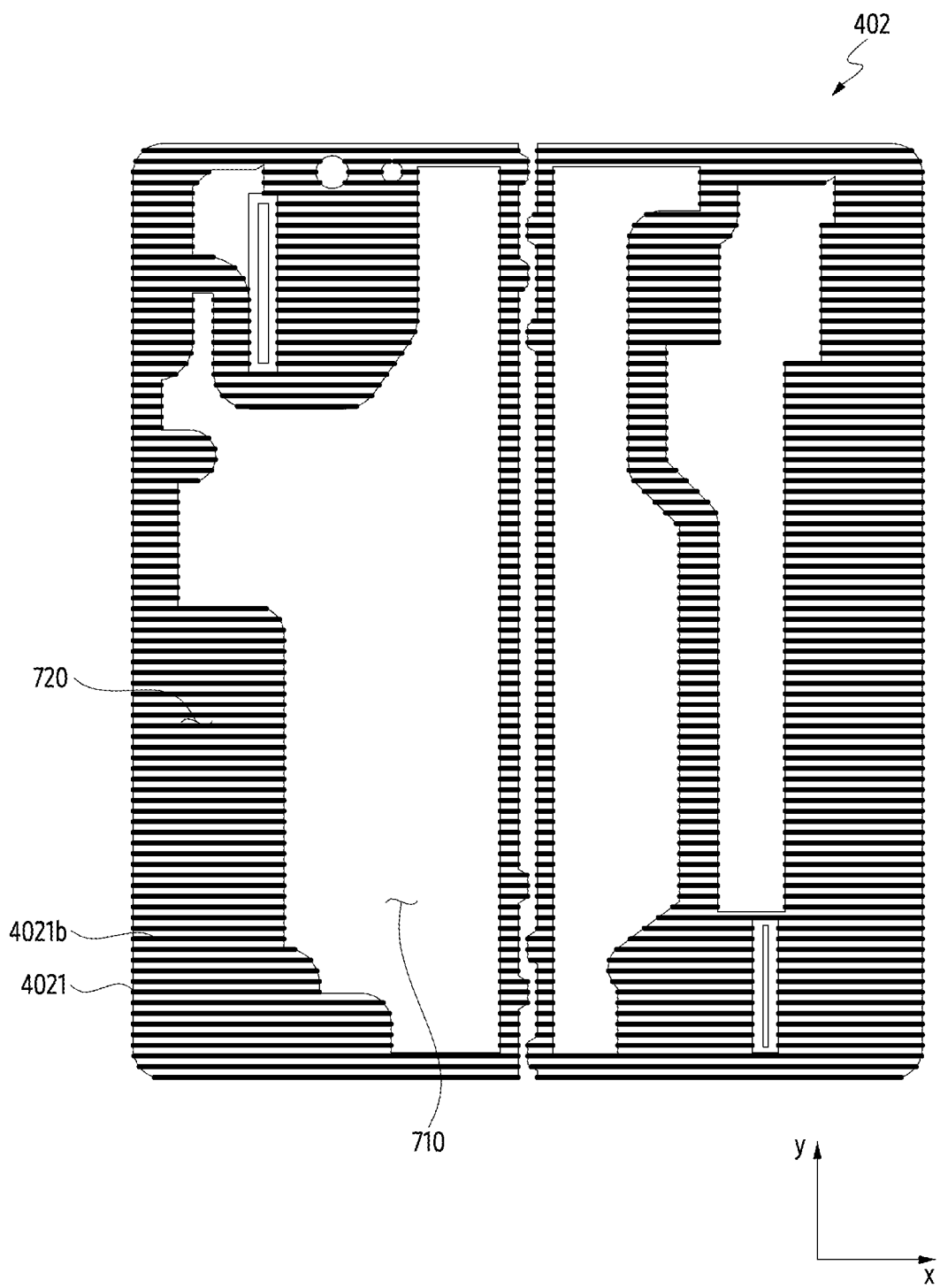
FIG. 8 is a diagram illustrating a state in which a part of a first dummy pattern included in a first pattern layer is removed according to various embodiments.
Figure 9:
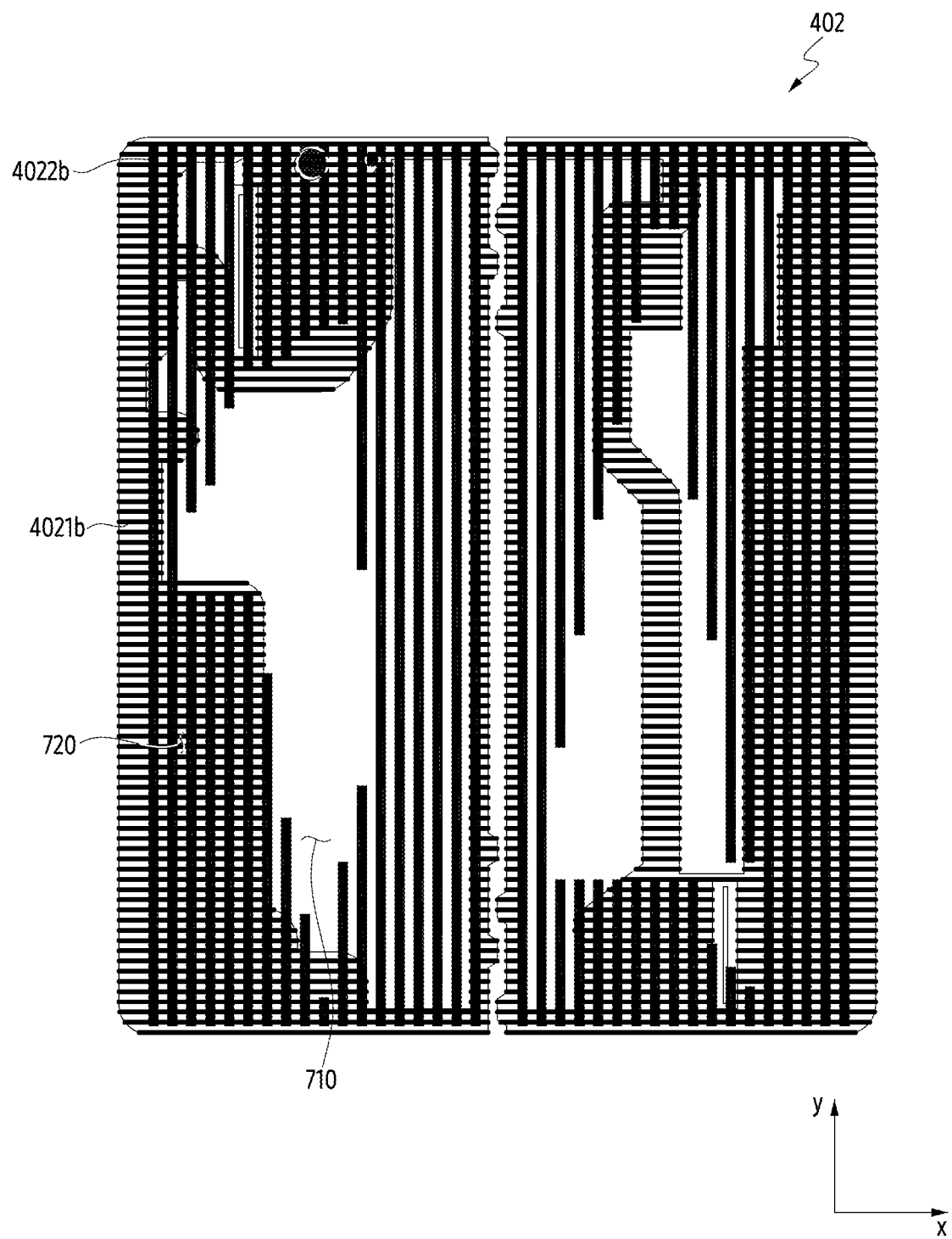
FIG. 9 is a diagram illustrating an input module in which a part of a first dummy pattern is removed, and a second dummy pattern is maintained according to various embodiments.

FIG. 8 is a diagram illustrating a state in which a part of a first dummy pattern included in a first pattern layer is removed according to various embodiments. FIG. 9 is a diagram illustrating an input module in which a part of a first dummy pattern is removed, and a second dummy pattern is maintained according to various embodiments.

Referring to FIG. 8, in the input module 402, a part of the first dummy pattern 4021b may be removed. As described above, the first area 710 may be an area in which a supporter (e.g., a supporter 790 of FIG. 7B) is maintained to be flat, or an area in which a component having a surface maintained to be flat is disposed, such as a battery. Since the first area 710 is advantageous in securing planarization, even when a part of the first dummy pattern 4021b is removed, planarization of the input module 402 may be secured.

According to an embodiment, the input module 402 may maintain the first dummy pattern 4021b in the second region 720 in which the support member 790 is not maintained flat or an electronic component having a curve is disposed. For example, the first dummy pattern 4021b may not be removed from the second area 720. The first dummy pattern 4021b may keep the input module 402 of the second area 720 flat together with the first signal patterns 4021a (e.g., the first signal patterns 4021a of FIG. 7B) disposed in a space between the first dummy patterns 4021b.

Referring to FIG. 9, the input module 402 may include the second dummy pattern 4022b and the first dummy pattern 4021b from which a part of the first dummy pattern is removed. According to an embodiment, the second dummy patterns 4022b are not removed, and only a part of the first dummy patterns 4021b may be removed. The second dummy patterns 4022b are portions in contact with the foldable display 401, and the second dummy patterns 4022b may maintain the foldable display 401 flat.

In the above-described embodiments, the first dummy patterns 4021b may be maintained in the second area 720 needing planarization, and may be removed from the first area 710 having a low demand for planarization due to structural factors. The second dummy patterns 4022b may be maintained in the entire area without being removed for visibility of the foldable display 401. However, the second dummy patterns 4022b support the foldable display 401 by a support plate (e.g., the support plate 450 of FIG. 4A) in contact with the second dummy patterns 4022b, and thus the entire may be removed. For example, as illustrated in FIG. 8, the entire second dummy patterns 4022b may be removed, and only a part of the first dummy patterns 4021b may be maintained. However, it is not limited thereto, and the second dummy patterns 4022b and the first dummy patterns 4021b may be removed from substantially the same area. For example, the second dummy patterns 4022b and the first dummy patterns 4021b may be removed from the first area 710 and/or the third area 730. The second dummy patterns 4022b and the first dummy patterns 4021b may be disposed in the second area 720 except for the first area 710 and the third area 730. For another example, the second dummy patterns 4022b may be removed from only a part of the first area 710 and/or the third area 730, and the first dummy patterns 4021b may be removed from the first area and the third area 730.

By removing a part of the first dummy pattern 4021b according to the above-described embodiment, the input module 402 may be lightened. The first dummy pattern 4021b may be disposed in an area needing waterproof maintenance and an area needing planarization to maintain planarization of the surface of the display 401 and secure waterproof performance of the electronic device.

Figure 10A:
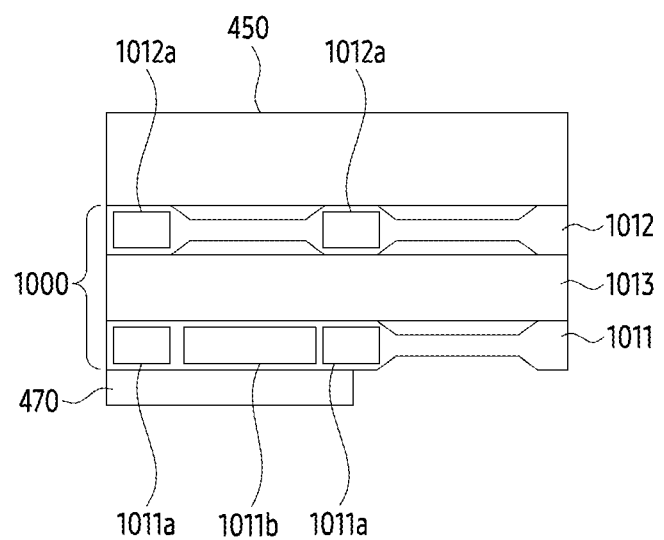
FIGS. 10A, 10B, and 10C are diagrams illustrating examples of removing a dummy pattern of an input module according to various embodiments.
Figure 10B:
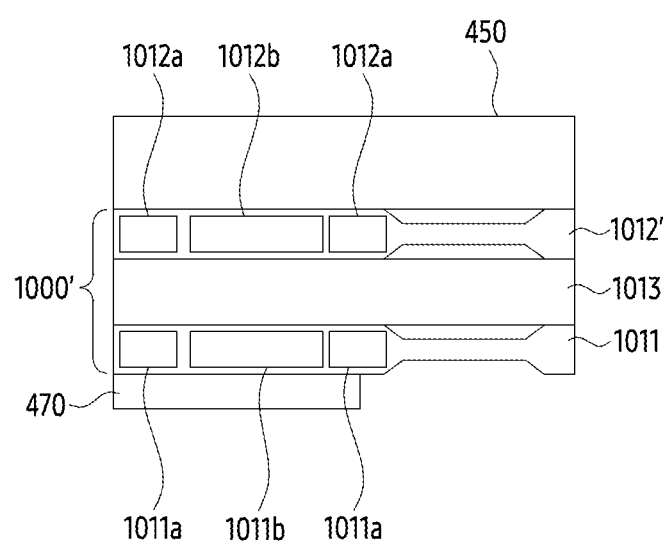
Figure 10C:
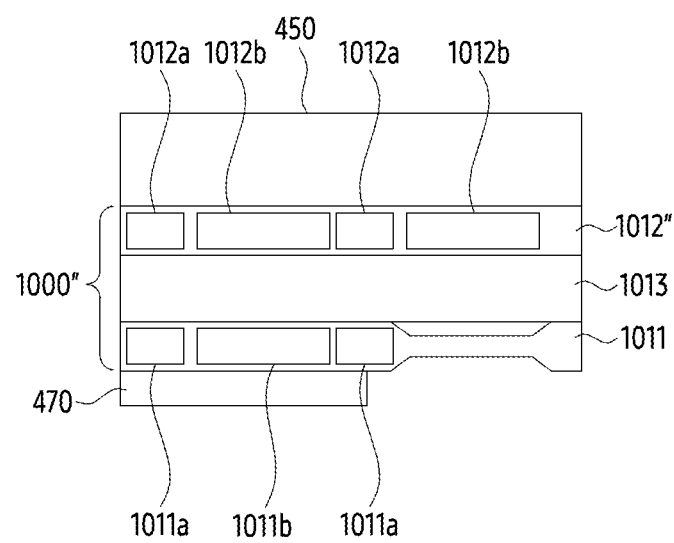

FIGS. 10A, 10B, and 10C are diagrams illustrating examples of removing a dummy pattern of an input module according to various embodiments.

Referring to FIGS. 10A, 10B, and 10C, an electronic device 101 may include an input module 1000 (e.g., an input module 402 of FIG. 4B), a support plate 450, and a waterproof adhesive 470.

According to an embodiment, the input module 1000 may be disposed between a display (e.g., a display 401 of FIG. 4A), a first housing (e.g., a first housing 210 of FIG. 2A), and a second housing (e.g., a second housing 220 of FIG. 2A). For example, the input module 1000 may be disposed on a surface of the first housing 210 and the second housing 220. The first housing 210 and the second housing 220 may support the input module 1000.

According to an embodiment, the input module 1000 may include a first pattern layer 1011, a second pattern layer 1012, and a non-conductive layer 1013. Each of the first pattern layer 1011 and the second pattern layer 1012 may include conductive patterns.

According to an embodiment, the first pattern layer 1011 may include first signal patterns 1011a and first dummy patterns 1011b. Each of the first signal patterns 1011a may be disposed to be spaced apart from each other. For example, each of the first signal patterns 1011a may be spaced apart from each other in a first direction and may be extended in a second direction perpendicular to the first direction. The first signal patterns 1011a disposed on the first pattern layer 1011 may be conductive patterns, and the first signal patterns 1011a may be surrounded by the first pattern layer 1011 or a non-conductive material forming an exterior of the first pattern layer 1011.

According to an embodiment, in case that the first pattern layer 1011 includes only the first signal patterns 1011a, the thickness of the first pattern layer 1011 in the area where the first signal patterns 1011a is disposed may be different from the thickness of the first pattern layer 1011 in the area where the first signal patterns 1011a are not disposed. Due to the different thicknesses of the first pattern layer 1011, it may be difficult for the first pattern layer 1011 to secure a flat surface.

According to an embodiment, the first dummy patterns 1011b may occupy a space formed between the first signal patterns 1011a. For example, the first dummy patterns 1011a may be disposed in the remaining area of the first pattern layer 1011 except for one area of the first pattern layer 1011 on which the first signal patterns 1011a are disposed. The first pattern layer 1011 may secure a flat surface by disposing first dummy patterns 1011b disposed in a space between the first signal patterns 1011a and the first signal patterns 1011a.

According to an embodiment, the second pattern layer 1012 may include second signal patterns 1012a and/or second dummy patterns 1012b. Referring to FIG. 10A, the second pattern layer 1012 may include second signal patterns 1012a. Each of the second signal patterns 1012a may be disposed to be spaced apart from each other. The second signal patterns 1012a may be extended in a direction perpendicular to the first signal patterns 1011a. For example, the first signal patterns 4021a of FIG. 5A may be perpendicular to each other like the second signal patterns 4022a of FIG. 6A.

According to an embodiment, the second signal patterns 1012a disposed on the second pattern layer 1012 may be conductive patterns, and the second signal patterns 1012a may be surrounded by the second pattern layer 1012 or a non-conductive material forming an exterior of the second pattern layer 1012.

According to an embodiment, in case that the second pattern layer 1012 includes only the second signal patterns 1012a, the thickness of the second pattern layer 1012 in the area where the second signal patterns 1012a is disposed may be different from the thickness of the second pattern layer 1012 in the area where the second signal patterns 1012a are not disposed.

Referring to FIGS. 10B and 10C, the second pattern layer 1012' or 1012" may further include second dummy patterns 1012b. The second dummy patterns 1012b may be disposed in a space between the second signal patterns 1012a. For example, the second dummy patterns 1012a may be disposed in the remaining area of the second pattern layer 1012 except for one area of the second pattern layer 1012 occupied by the second signal patterns 1012a. The second pattern layer 1012 may secure a flat surface by disposing second dummy patterns 1012b disposed in a space between the second signal patterns 1012a and the second signal patterns 1012a.

Referring to FIGS. 10A, 10B, and 10C, the non-conductive layer 1013 may be disposed between the first pattern layer 4021 and the second pattern layer 1012. The non-conductive layer 1013 may include at least one conductive via that electrically connects the first signal patterns 1011a of the first pattern layer 1011 and the second signal patterns 1012a of the second pattern layer 1012. The first signal patterns 1011a and the second signal patterns 1011b connected through at least one conductive via may detect approach or contact of an external object (e.g., a stylus pen).

According to an embodiment, a surface of the input module 1000, 1000' or 1000" facing a foldable display (e.g., a foldable display 401 of FIG. 4A) may be in contact with the support plate 450. The support plate 450 may support a display panel 410 (e.g., a display panel 410 of FIG. 4B). A part of the other surface opposite to the one surface of the input module 1000, 1000' or 1000" may be in contact with the waterproof adhesive. As described in FIG. 3, the waterproof adhesive may be disposed between the display panel and the side supporter to block moisture flowing into the electronic device.

According to an embodiment, the first dummy patterns 1011a of the first pattern layer 1011 and the second dummy patterns 1011b of the second pattern layer 1012 may be partially removed. Examples of the first pattern layer 1011 and the second pattern layer 1012 will be described below.

Referring back to FIG. 10A, the first pattern layer 1011 may include first dummy patterns 1011a in an area facing the waterproof adhesive 470. The first dummy patterns 1011b may not be disposed in an area where planarization is not required (e.g., a first area 710 of FIG. 7A).

According to an embodiment, the second pattern layer 1012 may include only the first signal patterns 1012a. The second pattern layer 1012 may not include a dummy pattern for separate planarization. In case that the influence of a curve of the second pattern layer 1012 is small due to the support plate 450, the second pattern layer 1012 may not separately include a dummy pattern.

Referring back to FIG. 10B, in the second pattern layer 1012', like the first pattern layer 1011, dummy patterns may be removed from an area where planarization is not required (e.g., a first area 710 of FIG. 7A).

Referring back to FIG. 10B, the second pattern layer 1012" may include second signal patterns 1012a and second dummy patterns 1012b. The second dummy patterns 1012b may fill spaces between the second signal patterns 1012a. The second dummy patterns 1012b may also be disposed in the first area 710.

According to an embodiment, in case that the support plate 450 is thinly disposed and has an enormous influence on the display panel, the second dummy patterns 1012b may not be separately removed.

According to the above-described embodiment, the first dummy patterns 1011b may be located in an area where the waterproof adhesive 470 is disposed, and may be removed from a part of the remaining area. Some of the second dummy patterns 1012b may be omitted in case that planarization may be secured by a mechanical structure such as the support plate 450.

By removing not only the first dummy patterns 1011b but also the second dummy patterns 1012b, the weight of the input module 1000, 1000' or 1000" may be reduced.

Figure 11:
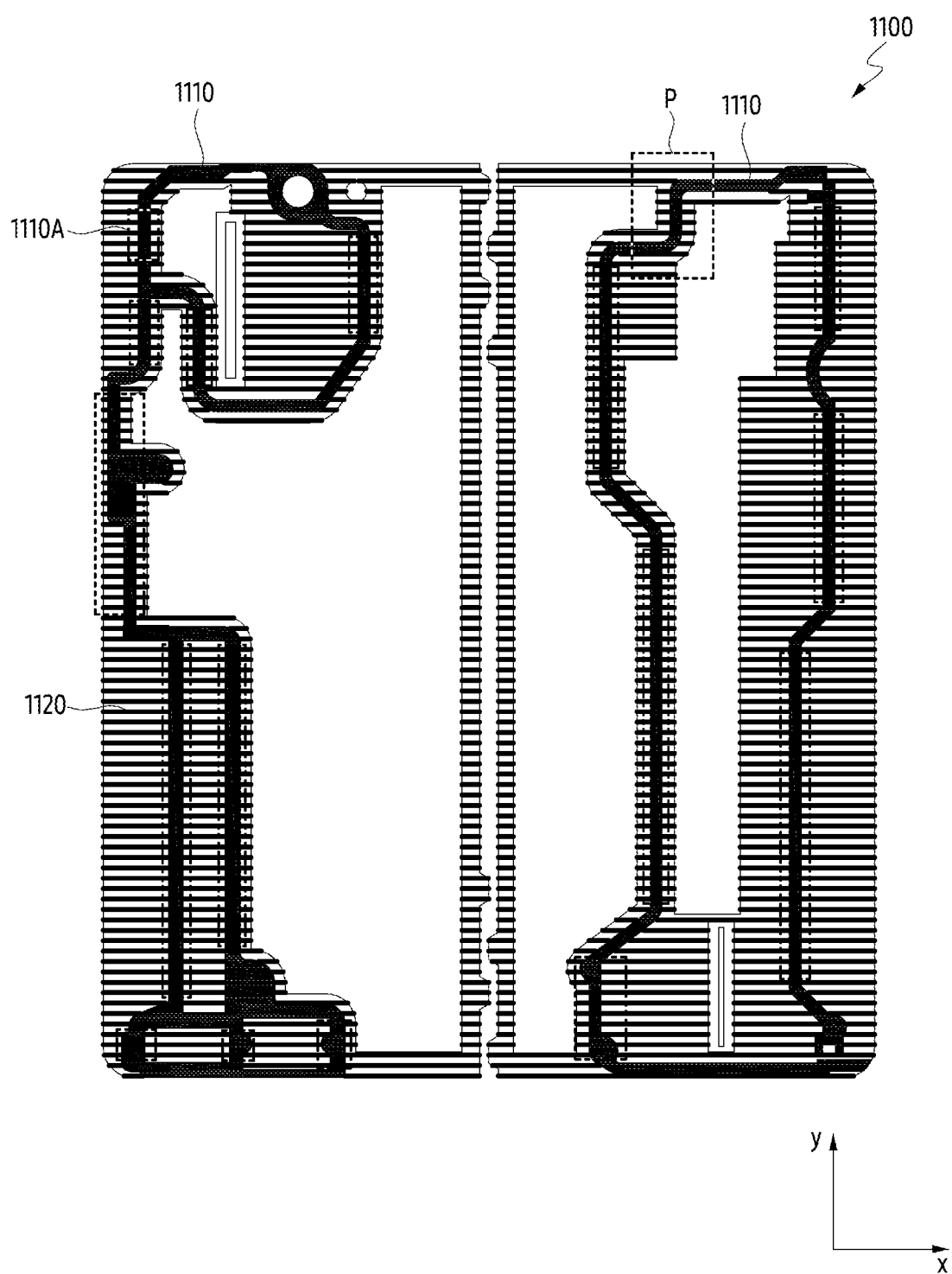
FIG. 11 is a diagram illustrating a waterproof adhesive and a dummy pattern disposed in a digitizer according to various embodiments.
Figure 12:
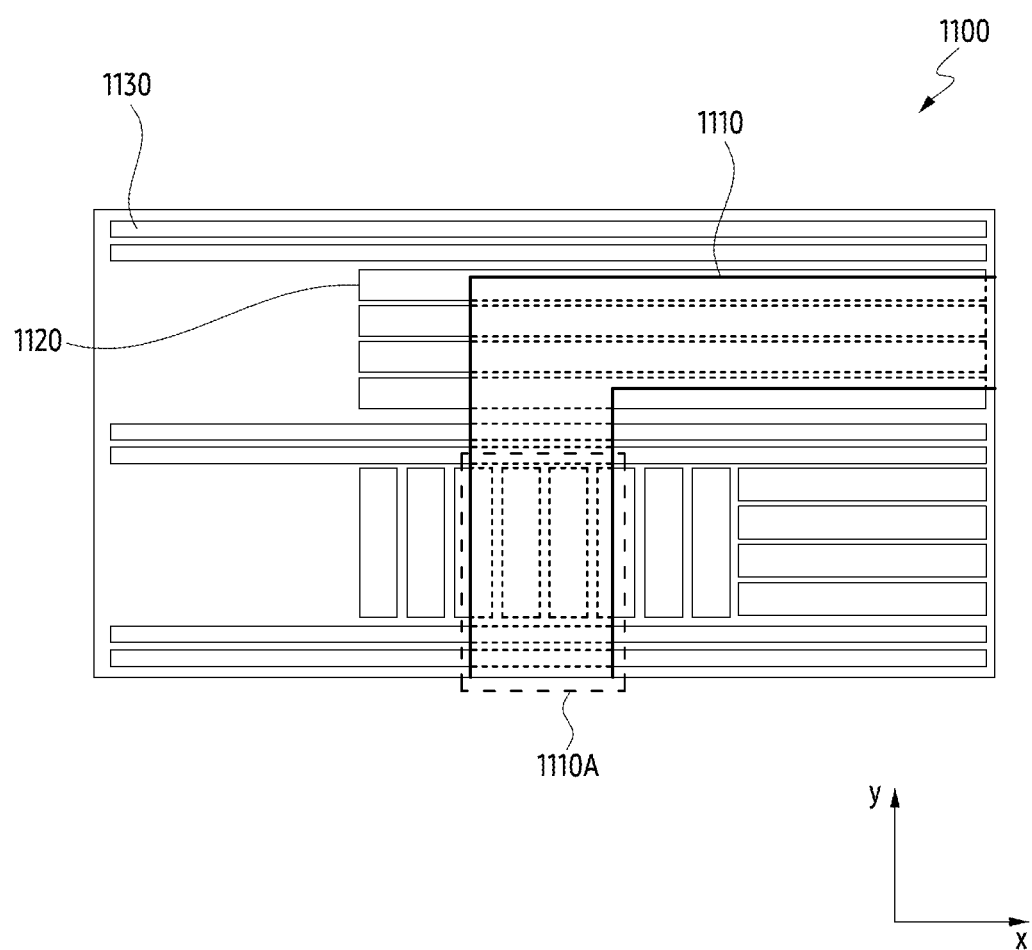
FIG. 12 is a diagram illustrating a deformed dummy pattern in area P of FIG. 11 according to various embodiments.

FIG. 11 is a diagram illustrating a waterproof adhesive and a dummy pattern disposed in a digitizer according to various embodiments. FIG. 12 is a diagram illustrating a deformed dummy pattern in area P of FIG. 11 according to various embodiments.

Referring to FIGS. 11 and 12, an input module 1100 (e.g., an input module 402 of FIG. 4A) may include first dummy patterns 1120 (e.g., a first dummy patterns 4021b of FIG. 4B) facing the waterproof adhesive 1110.

According to an embodiment, the first dummy patterns 1120 may be extended in a first direction (+x direction), may be disposed in an area requiring planarization according to a structure (e.g., a second area 720 of FIG. 7), and may be removed from the remaining area (e.g., a first area 710 and a third area 730 of FIG. 7). The first dummy patterns 1120 have been described as extending in the first direction (+x direction), but are not limited thereto, and may be extended in the second direction (+y direction) perpendicular to the first direction (+x direction).

According to an embodiment, a direction in which the first dummy pattern 1120 extends and a direction in which the waterproof adhesive extends may be substantially the same. For example, a waterproof adhesive 1110 disposed in an area 1110A in which the first dummy pattern 1120 extends along the first direction (+x direction) may be extended along the first direction (+x direction). The waterproof adhesive 1110 disposed in the area 1110A in which the first dummy pattern 1120 extends along the second direction (+y direction) may be extended along the second direction (+y direction).

According to an embodiment, referring to the area P, a first signal patterns 1130 may be extended along the first direction (+x direction). The first dummy patterns 1120 disposed between the first signal patterns 1130 may be extended along the same first direction (+x direction) as the extension direction of the first signal patterns 1130. In the input module 1100, directions of the first signal patterns 1130 and the first dummy patterns 1120 may be disposed in substantially the same direction.

According to an embodiment, moisture transferred to the waterproof adhesive 1110 may prevent and/or reduce moisture from flowing into a closed curve formed by the waterproof adhesive 1110 through the first dummy patterns 1120. In an area where the waterproof adhesive 1110 and the first dummy patterns 1120 are formed in a perpendicular direction, there is a risk that moisture may flow into the closed curve through the space between the first dummy patterns 1120. In an area where the waterproof adhesive 1110 and the first dummy patterns 1120 are formed in a parallel direction, a space between the first dummy patterns 1120 may minimize and/or reduce exposure to an inflow path of moisture, thereby securing waterproof performance.

According to the above-described embodiment, by disposing extension direction of each of the waterproof adhesive 1110 and the first dummy patterns 1120 in parallel to each other, waterproof performance may be secured, and a step difference may be minimized and/or reduced. Through minimization/reduction of the step difference, it is possible to prevent and/or reduce the patterns 1120 and 1130 of the input module 1100 from being visually recognized from the outside.

According to the various example embodiments, an electronic device (e.g., the electronic device 101 of FIG. 2A) may comprise: a first housing (e.g., a first housing 210 of FIG. 2A) including a first surface (e.g., a first surface 211 of FIG. 2A) facing a first direction; a second housing including a second surface (e.g., a second surface 221 of FIG. 2A) facing the first direction; a hinge structure including a hinge (e.g., a hinge structure 260 of FIG. 2C) rotatably connecting the first housing and the second housing with respect to a folding axis (e.g., a folding axis 237 of FIG. 2A) and configured to provide an unfolded state in which the first surface and the second surface face the same direction or a folded state in which the first surface and the second surface face each other.

The electronic device according to an example embodiment may further comprise: a flexible display (e.g. a flexible display 230 of FIG. 2A) disposed on the first surface and the second surface across the folding axis, including a first display area (e.g., a first display area 231 of FIG. 2A) corresponding the first surface, a second display area (e.g., a second display area 232 of FIG. 2A), corresponding the second surface and a third display area (e.g., a third display area 233 of FIG. 2A) between the first display area and the second display area; an input module (e.g., an input module 402 of FIG. 4B) including a first pattern layer and a second pattern layer, the input module disposed between the flexible display and a surface formed by the first housing and the second housing, and configured to detect an external object based on an electromagnetic interaction between the external object and the first pattern layer (e.g., the first pattern layer 4021 of FIG. 4B)) and the second pattern layer (e.g., the second pattern layer 4022 of FIG. 4B); and waterproof adhesive (e.g., waterproof adhesives 470 of FIG. 4B) disposed on each of the first housing and the second housing.

According to an example embodiment, the first pattern layer may be in contact with the waterproof adhesives and may include first dummy patterns (e.g., first dummy patterns 4021*b* of FIG. 4B) disposed in an area facing first signal patterns (e.g., first signal patterns 4021*a* of FIG. 4B) and the waterproof adhesive.

According to an example embodiment, the second pattern layer may be in contact with the flexible display.

According to an example embodiment, the input module may further include a non-conductive layer (e.g., a non-conductive layer 4023 of FIG. 4B).

According to an example embodiment, the non-conductive layer may be disposed between the first pattern layer and the second pattern layer.

According to an example embodiment, the non-conductive layer may include at least one conductive via (e.g., a conductive via 4023*a* of FIG. 4B) configured to connect the first pattern layer and the second pattern layer.

According to an example embodiment, the second pattern layer may include a second signal pattern (e.g., a second signal pattern 4022*a* of FIG. 4B) and a second dummy pattern (e.g., a second dummy pattern 4022*b* of FIG. 4B).

According to an example embodiment, a second signal pattern may be extended in a direction different from the direction of the first signal pattern.

According to an example embodiment, the second dummy pattern may be disposed in a space between the second signal patterns.

According to an example embodiment, the second pattern layer may include second dummy patterns disposed in an area facing the waterproof adhesive.

According to an example embodiment, a part of the first dummy patterns facing the waterproof adhesive may be extended in a different direction from remaining parts of the first dummy patterns.

According to an example embodiment, the flexible display may include a flexible display panel (e.g., a display panel 410 of FIG. 4A) and a support plate supporting the flexible display panel (e.g., a support plate 450 of FIG. 4B).

According to an example embodiment, the support plate may include a metal having a rigidity or a carbon fiber reinforced plastic (CFRP).

According to an example embodiment, second dummy patterns disposed between the second signal patterns and the second pattern layer including the second signal patterns may be in contact with a surface of the support plate.

According to an example embodiment, the flexible display may include a flexible printed circuit board bending and extending from one edge of the flexible display to an inner surface formed by the first housing or the second housing.

According to an example embodiment, a part of the first dummy patterns may face the flexible printed circuit board.

According to an example embodiment, the input module may include a slit (e.g., a slit (S) of FIG. 4A) disposed in an area parallel to and spaced apart from the one edge of the flexible display panel.

According to an example embodiment, at least one supporter configured to support the input module and the flexible display may be further included.

According to an example embodiment, the supporter may include protrusions protruding from a surface facing the input module.

According to an example embodiment, a part of the first dummy patterns may face an area including the protrusions.

According to an example embodiment, a part of the first dummy patterns may be disposed along an edge of the flexible display.

According to an example embodiment, a thickness of a part of the first pattern layer corresponding to the waterproof adhesive may be thicker than a thickness of another part of the first pattern layer.

According to an example embodiment, a height from a surface of the first pattern layer to the first signal patterns may be the same as a height from a surface of the first pattern layer to the first dummy patterns.

According to an example embodiment, the first signal patterns and the second signal patterns may be configured to detect the external object, including a stylus pen, based on a change in a magnetic field between the first signal patterns and the second signal patterns.

According to an example embodiment, the electronic device (e.g., the electronic device 101 of FIG. 4A) may comprise: a first housing (e.g., a first housing 410 of FIG. 2A) including a first surface facing a first direction; a second housing (e.g., a second housing 420 of FIG. 2A) including a second surface facing the first direction; a hinge structure including a hinge (e.g., a hinge structure 260 of FIG. 2C) rotatably connecting the first housing and the second housing with respect to a folding axis and configured to provide an unfolded state in which the first surface and the second surface face the same direction or a folded state in which the first surface and the second surface face each other.

According to an example embodiment, the electronic device may comprise: a flexible display (e.g., a flexible display 230 of FIG. 2A) disposed on the first surface and the second surface across the folding axis, including a first display area (e.g., a first display area 231 of FIG. 2A) corresponding the first surface, a second display area (e.g., a second display area 232 of FIG. 2A) corresponding the second surface and a third display area (e.g., a third display area 233 of FIG. 2A) between the first display area and the second display area; an input module including a first pattern layer (e.g., a first pattern layer 4021 of FIG. 4B) and a second pattern layer (e.g., a second pattern layer 4022 of FIG. 4B), the input module disposed between the flexible display and a surface formed by the first housing and the second housing, and configured to detect an external object based on an electromagnetic interaction between the external object and the first pattern layer and the second pattern layer; and waterproof adhesives (e.g., waterproof adhesives 470 of FIG. 4B) disposed on each of the first housing and the second housing.

According to an example embodiment, the first pattern layer may be disposed on a surface of the input module facing the waterproof adhesives and may include first signal patterns (e.g., first signal patterns 4021a of FIG. 4B) and first dummy patterns (e.g., first dummy patterns 4021b of FIG. 4B).

According to an example embodiment, the second pattern layer may be disposed on another surface of the input module facing the flexible display and may include second signal patterns disposed in a direction perpendicular to the first signal patterns and second dummy patterns disposed between the second signal patterns.

According to an example embodiment, the first dummy patterns and the second dummy patterns may overlap each other, in an area corresponding to the waterproof adhesive, when the flexible display is viewed from the outside in the unfolded state, and the second dummy patterns among the first dummy pattern and the second dummy patterns may be disposed in a remaining area spaced apart from the waterproof adhesive.

According to an example embodiment, the input module may include a non-conductive layer disposed between the first pattern layer and the second pattern layer and at least one conductive via passing through the non-conductive layer and connecting the first pattern layer and the second pattern layer.

According to an example embodiment, a part of the first dummy patterns may be in contact with the waterproofing adhesive, extend in a same direction as an extension direction of the waterproof adhesive.

According to an example embodiment, the flexible display may include a flexible display panel and a support plate. The support plate may include a metal having a rigidity or a carbon fiber reinforced plastic (CFRP) and may be disposed between the flexible display panel and the input module.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art the various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A foldable electronic device comprising:
a first housing including a first bracket;
a second housing including a second bracket;
a hinge structure, comprising a hinge, configured to rotatably connect at least the first housing and the second housing;
an input module disposed above the first bracket and the second bracket, including a layer including a plurality of conductive portions comprising conductive material, configured to be used for identifying an input of a stylus, spaced apart from each other; and
a display disposed on the input module; and
waterproof adhesives disposed on each of the first bracket and the second bracket, wherein at least one of the waterproof adhesives is attached to a portion of the layer of the input module;
wherein the portion of the layer of the input module attached to the at least one of the waterproof adhesives further includes dummy portions between conductive portions included in the portion of the layer of the input module, relative to another portion of the layer of the input module detached from the waterproof adhesives,
wherein the portion of the layer is in contact with the at least one of the waterproof adhesives, and
wherein the another portion of the layer is spaced apart from the waterproof adhesives.

2. The electronic device of claim 1,
wherein the another portion of the layer is spaced apart from the waterproof adhesives with no other layers of the input module.

3. The electronic device of claim 1, wherein the dummy portions of the portion of the layer extends in a same direction as an extension direction of the at least one of the waterproof adhesives.

4. The electronic device of claim 1, wherein the dummy portions are electrically isolated from the conductive portions included in the portion of the layer of the input module.

5. The electronic device of claim 1, wherein the input module includes a first layer which is the layer, and a second layer, and a non-conductive layer on the first layer, and
wherein the second layer includes a plurality of conductive portions spaced apart from each other.

6. The electronic device of claim 5, wherein the conductive portions of the second layer are extending in a direction distinct from an extension direction of the conductive portions of the first layer.

7. The electronic device of claim 6, wherein the second layer of the input module further includes dummy portions disposed between the conductive portions of the second layer.

8. The electronic device of claim 1, wherein the display includes a display panel and a support plate supporting the display and disposed between the display and the input module.

9. The electronic device of claim 8, wherein the input module includes a first layer which is the layer, and a second layer, and a non-conductive layer on the first layer, and
wherein the second layer is attached to the support plate.

10. The electronic device of claim 8, wherein the support plate includes a metal having a rigidity or a carbon fiber reinforced plastic.

11. The electronic device of claim 8, wherein the display includes a flexible printed circuit board extending from an edge of the display and bending to an inner surface defined by the first housing or the second housing,
wherein the dummy portions are disposed on an area facing the flexible printed circuit board, and
wherein the input module includes a slit configured to be bent together with the flexible printed circuit board.

12. The electronic device of claim 1, wherein the dummy portions are disposed along an edge of the display.

13. The electronic device of claim 1, wherein a thickness of the portion of the layer is greater than a thickness of the another portion of the layer.

14. The electronic device of claim 1, wherein a height the conductive portions is equal to a height the dummy portions.

15. The electronic device of claim 1, wherein the input module includes a first layer which is the layer, and a second layer, and a non-conductive layer on the first layer, and
wherein the second layer includes conductive portions and dummy portions disposed between the conductive portions of the second layer, and
wherein the conductive portions of the first layer and the conductive portions of the second layer are configured to identifying an input by an external object, based on a change in a magnetic field between the conductive portions of the first layer and the conductive portions of the second layer.

16. A foldable electronic device comprising:
a first housing including a first bracket;
a second housing including a second bracket, and rotatably connected to the first housing;
an input module disposed above the first bracket and the second bracket, including a first layer and a second layer, the input module configured to be used for identifying an input of a stylus, spaced apart from each other;
a display disposed on the input module; and
waterproof adhesives disposed on each of the first bracket and the second bracket, wherein at least one of the waterproof adhesives is attached to a portion of the first layer of the input module;
wherein the first layer defines a surface of the input module facing the first bracket and the second bracket, the first layer including first conductive portions and first dummy portions disposed between the first conductive portions,
wherein the second layer defines another surface of the input module facing the display, the second layer including second conductive portions, third conductive portions, fourth conductive portions, second dummy portions disposed between the second conductive portions and the third conductive portions, and third dummy portions disposed between the third conductive portions and the fourth conductive portions,
wherein the portion of the first layer attached to the at least one of the waterproof adhesives includes the first dummy portions of the first layer overlapping the second dummy portions of the second layer and is in contact with the at least one of the waterproof adhesives, and
wherein another portion of the first layer overlapping the third dummy portions of the second layer is detached from the waterproof adhesives.

17. The electronic device of claim 16, wherein the display includes a display panel and a support plate formed from a metal having rigidity or a carbon fiber reinforced plastic and is disposed between the display panel and the input module.

18. The electronic device of claim 16, wherein the input module includes a non-conductive layer disposed between the first layer and the second layer.

19. A foldable electronic device comprising:
a first housing including a first bracket;
a second housing including a second bracket, and rotatably connected to the first housing;
an input module disposed above the first bracket and the second bracket, including a first layer and a second layer, the input module configured to be used for identifying an input of a stylus, spaced apart from each other;
a display disposed on the input module; and
waterproof adhesives disposed on each of the first bracket and the second bracket, wherein at least one of the waterproof adhesives is attached to a portion of the first layer of the input module,
wherein the first layer defines a surface of the input module facing the first bracket and the second bracket, the first layer including first conductive portions and first dummy portions disposed between the first conductive portions,
wherein the second layer defines another surface of the input module facing the display, the second layer including second conductive portions, third conductive portions, fourth conductive portions, second dummy portions disposed between the second conductive portions and the third conductive portions, and third dummy portions disposed between the third conductive portions and the fourth conductive portions,
wherein the portion of the first layer attached to the at least one of the waterproof adhesives includes the first dummy portions of the first layer overlapping the second dummy portions of the second layer,
wherein another portion of the first layer overlapping the third dummy portions of the second layer is detached from the waterproof adhesives, and
wherein the first dummy portions are in contact with the waterproof adhesives in the portion and extend in a same direction as an extension direction of the at least one of the waterproof adhesives.

* * * * *